United States Patent
Koh et al.

(10) Patent No.: US 12,057,357 B2
(45) Date of Patent: Aug. 6, 2024

(54) SEMICONDUCTOR PACKAGE INCLUDING PLURALITY OF RECESSES AND MOLDING MEMBER WITH PLURALITY OF PROTRUSIONS THAT FILL THE RECESSES

(71) Applicant: SAMSUNG ELECTRONICS CO., LTD., Suwon-si (KR)

(72) Inventors: Kyong Hwan Koh, Suwon-si (KR); Jongwan Kim, Cheonan-si (KR); Juhyeon Oh, Asan-si (KR); Yongkwan Lee, Gyeonggi-do (KR)

(73) Assignee: SAMSUNG ELECTRONICS CO, LTD., Suwon-si (KR)

( * ) Notice: Subject to any disclaimer, the term of this patent is extended or adjusted under 35 U.S.C. 154(b) by 409 days.

(21) Appl. No.: 17/212,417

(22) Filed: Mar. 25, 2021

(65) Prior Publication Data
US 2022/0051957 A1  Feb. 17, 2022

(30) Foreign Application Priority Data

Aug. 12, 2020 (KR) .................. 10-2020-0101335

(51) Int. Cl.
*H01L 23/48* (2006.01)
*H01L 21/48* (2006.01)
(Continued)

(52) U.S. Cl.
CPC .......... *H01L 23/13* (2013.01); *H01L 21/4803* (2013.01); *H01L 21/561* (2013.01); *H01L 23/3107* (2013.01); *H01L 23/49838* (2013.01); *H01L 23/49827* (2013.01); *H01L 24/06* (2013.01); *H01L 24/48* (2013.01); *H01L 24/49* (2013.01); *H01L 24/73* (2013.01);
(Continued)

(58) Field of Classification Search
CPC ............... H01L 23/13; H01L 23/3107; H01L 23/49838; H01L 23/49827; H01L 24/06; H01L 24/48; H01L 24/49; H01L 2224/06135; H01L 2224/48227; H01L 2224/49173
USPC ........................................ 257/774
See application file for complete search history.

(56) References Cited

U.S. PATENT DOCUMENTS 7,101,733 B2  9/2006  Huang
7,282,431 B2  10/2007  Kang et al.
(Continued)

FOREIGN PATENT DOCUMENTS

KR  20170082677  7/2017

*Primary Examiner* — Kimberly N Rizkallah
*Assistant Examiner* — Dilinh P Nguyen
(74) *Attorney, Agent, or Firm* — F. CHAU & ASSOCIATES, LLC

(57) ABSTRACT

A semiconductor package includes a base substrate that includes a first surface and a second surface that face each other, a plurality of first metal line patterns disposed on the first surface, a plurality of second metal line patterns disposed on the second surface, a plurality of vias that penetrate the base substrate and connect the first metal line patterns to the second metal line patterns, a semiconductor chip disposed on the first surface, and a molding member that covers the first surface and the semiconductor chip. The base substrate includes at least one recess at a corner of the base substrate. The recess extends from the first surface toward the second surface. The molding member includes a protrusion that fills the recess.

18 Claims, 31 Drawing Sheets

(51) Int. Cl.
　　　*H01L 21/56*　　　(2006.01)
　　　*H01L 23/13*　　　(2006.01)
　　　*H01L 23/31*　　　(2006.01)
　　　*H01L 23/498*　　(2006.01)
　　　*H01L 23/52*　　　(2006.01)
　　　*H01L 23/00*　　　(2006.01)

(52) U.S. Cl.
　　　CPC ............ *H01L 2224/06135* (2013.01); *H01L 2224/48227* (2013.01); *H01L 2224/49173* (2013.01); *H01L 2224/73265* (2013.01)

(56) References Cited

U.S. PATENT DOCUMENTS

| | | | |
|---|---|---|---|
| 7,390,688 B2 | 6/2008 | Wakabayashi et al. | |
| 7,786,008 B2 | 8/2010 | Do et al. | |
| 7,833,881 B2 | 11/2010 | Farnworth | |
| 8,866,267 B2 | 10/2014 | Feng et al. | |
| 9,136,154 B2 | 9/2015 | Feng et al. | |
| 9,922,965 B2 * | 3/2018 | Kim | H01L 21/31058 |
| 2017/0162544 A1 * | 6/2017 | Kwak | H01L 23/49827 |
| 2020/0111763 A1 * | 4/2020 | Hong | H01L 24/08 |
| 2020/0161279 A1 * | 5/2020 | Mok | H01L 23/5384 |

* cited by examiner

SEMICONDUCTOR PACKAGE INCLUDING PLURALITY OF RECESSES AND MOLDING MEMBER WITH PLURALITY OF PROTRUSIONS THAT FILL THE RECESSES

CROSS-REFERENCE TO RELATED APPLICATION

This U.S. nonprovisional application claims priority under 35 U.S.C § 119 from Korean Patent Application No. 10-2020-0101335, filed on Aug. 12, 2020 in the Korean Intellectual Property Office, the contents of which are herein incorporated by reference in their entirety.

BACKGROUND

Embodiments of the present inventive concepts are directed to a semiconductor package.

A semiconductor package can implement an integrated circuit chip for use in electronic products. A typical semiconductor package has a semiconductor chip mounted on a printed circuit board, and bonding wires or bumps are used to electrically connect the semiconductor chip to the printed circuit board. Various studies have been conducted to improve reliability and durability of semiconductor packages.

SUMMARY

Some embodiments of the present inventive concepts provide a semiconductor package in which warpage occurs uniformly.

Some embodiments of the present inventive concepts provide a semiconductor package with reduced warpage.

According to some embodiments of the present inventive concepts, a semiconductor package includes: a base substrate that includes a first surface and a second surface that face each other; a plurality of first metal line patterns disposed on the first surface; a plurality of second metal line patterns disposed on the second surface; a plurality of vias that penetrate the base substrate and connect the first metal line patterns to the second metal line patterns; a semiconductor chip disposed on the first surface; and a molding member that covers the first surface and the semiconductor chip. The base substrate includes at least one recess at a corner of the base substrate. The recess extends from the first surface toward the second surface. The molding member includes a protrusion that fills the recess.

According to some embodiments of the present inventive concepts, a semiconductor package includes: a base substrate that includes a first surface and a second surface that face each other; a first solder resist layer disposed on the first surface and that covers the first metal line patterns; a second solder resist layer disposed on the second surface and that covers the second metal line patterns; a semiconductor chip disposed on the first surface; and a molding member that covers the first surface and the semiconductor chip. The molding member penetrates at least a portion of the base substrate at a corner of the base substrate. The molding member includes: a body formed on a top surface of the first solder resist layer; and at least one protrusion that extends from the body toward the second surface at the corner of the base substrate.

According to some embodiments of the present inventive concepts, a semiconductor package includes: a dielectric layer that includes a first surface and a second surface that face each other, where the dielectric layer includes a plurality of recesses at respective corners of the dielectric layer that extend from the first surface toward the second surface; a semiconductor chip disposed on the first surface; and a molding member that includes a body that covers the first surface and the semiconductor chip and a plurality of protrusions that fill the plurality of recesses and extend between the second surface and the first surface of the dielectric layer at respective corners of the dielectric layer. The plurality of protrusions are formed on corresponding vertices of the second surface. When viewed in a plan view, each of the plurality of protrusions has an "L" shape on one of the corresponding vertices of the second surface.

DETAILED DESCRIPTION OF EMBODIMENTS

A semiconductor package according to embodiments of the present inventive concepts will be hereinafter described with reference to accompanying drawings.

Figure 1A:
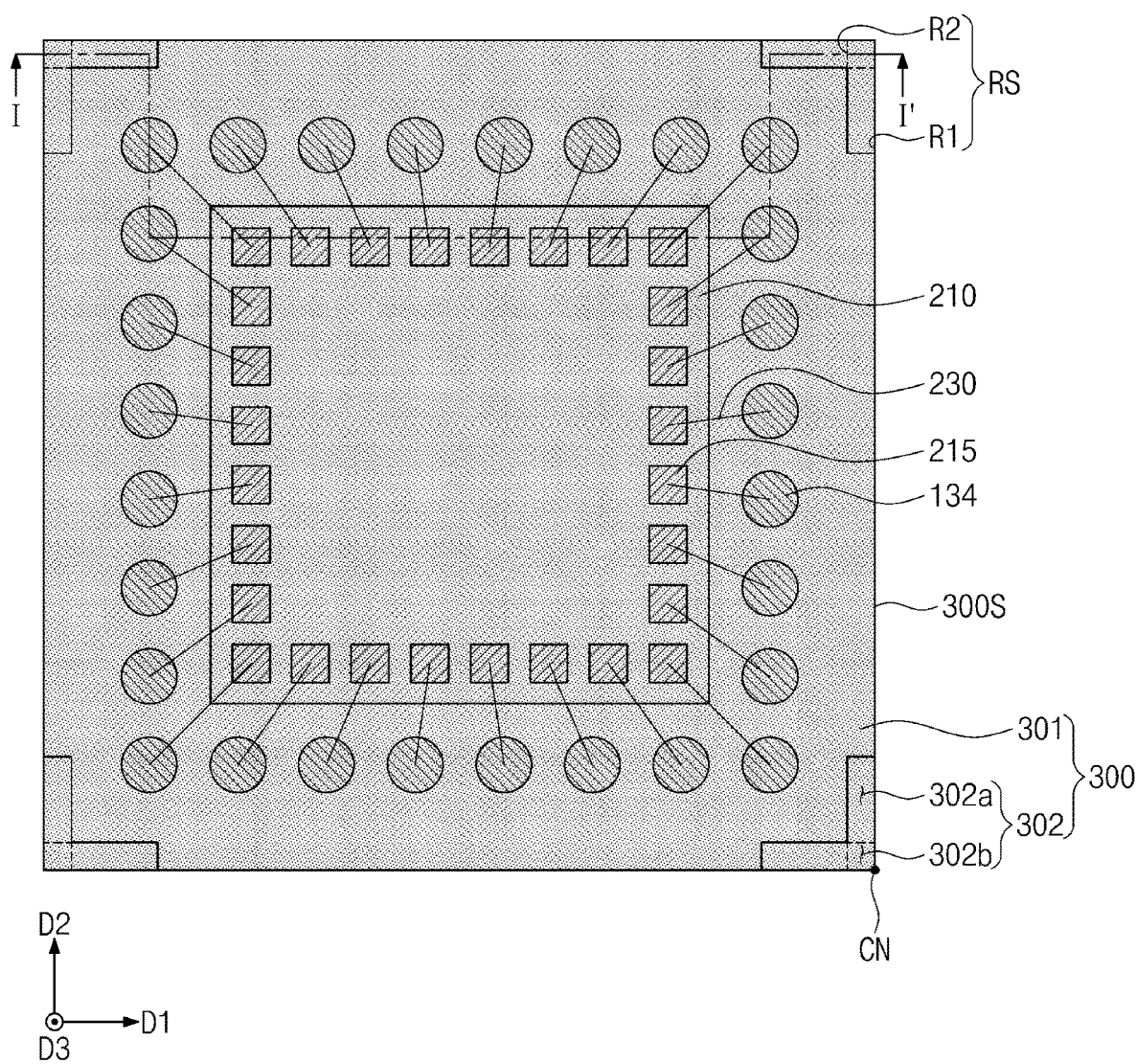
FIG. 1A is a plan view of a semiconductor package according to some embodiments of the present inventive concepts.
Figure 1B:
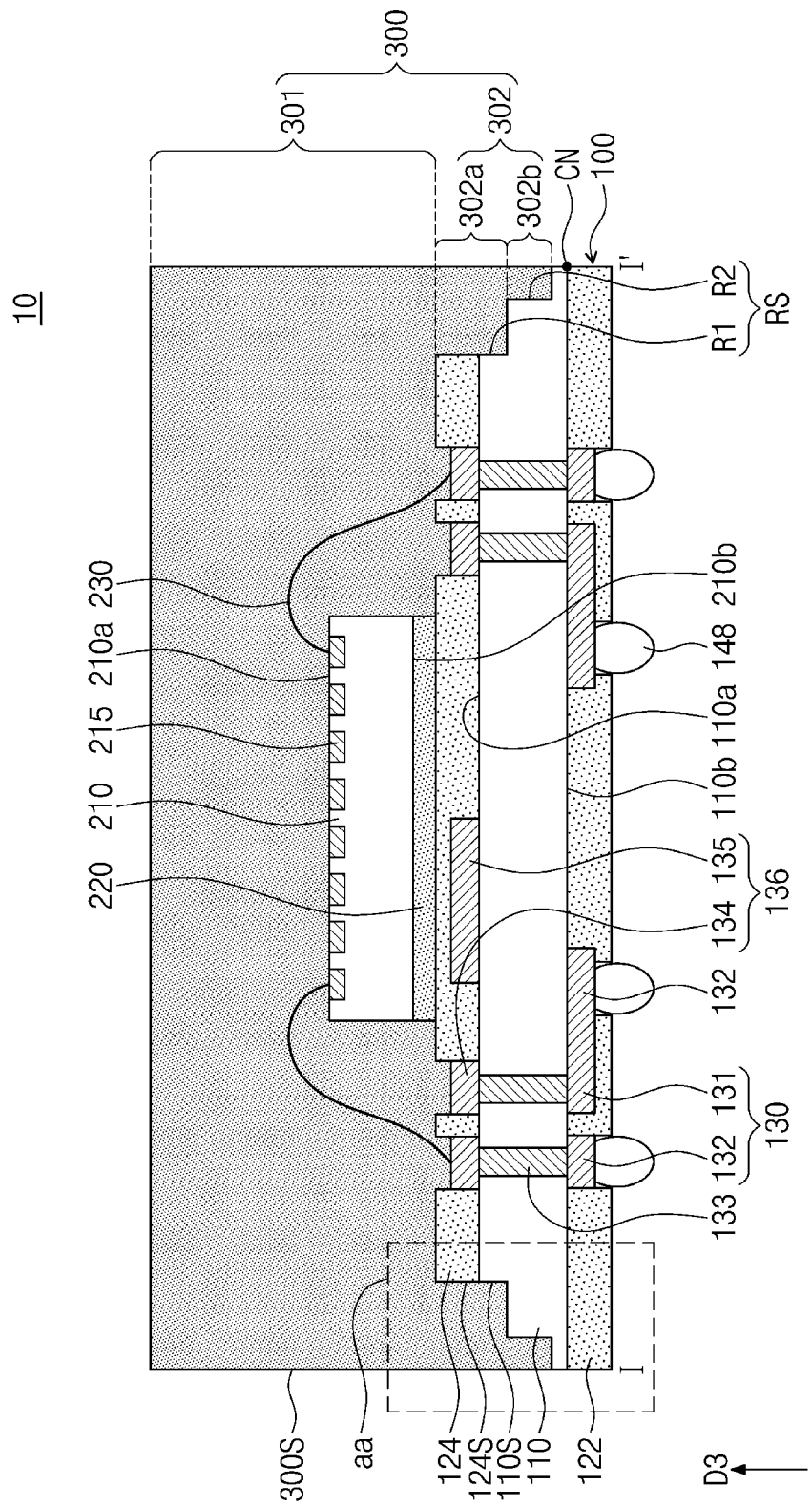
FIG. 1B is a cross-sectional view taken along line I-I' of FIG. 1A.

FIG. 1A is a plan view of a semiconductor package 10 according to some embodiments of the present inventive concepts. FIG. 1B is a cross-sectional view taken along line I-I' of FIG. 1A. Some components of FIG. 1B are omitted in FIG. 1A to more clearly illustrate other components.

Referring to FIGS. 1A and 1B, in an embodiment, the semiconductor package 10 includes a package substrate 100, a semiconductor chip 210, and a molding member 300 that are sequentially stacked. For example, the package substrate 100 is a printed circuit board (PCB).

In an embodiment, the package substrate 100 includes a core layer 110, first metal line patterns 136, second metal line patterns 130, vias 133, a first solder resist layer 124, and a second solder resist layer 122.

In an embodiment, the core layer 110 has a first surface 110a and a second surface 110b that face each other. In this description, a first direction D1 is a direction parallel to the first surface 110a of the core layer 110. A second direction D2 is a direction parallel to the first surface 110a and perpendicular to the first direction D1. A third direction D3 is a direction perpendicular to the first surface 110a.

In an embodiment, the core layer 110 includes a dielectric layer. The core layer 110 may include glass fiber or resin. The glass fiber can be obtained by twisting several hundred glass filaments of reinforcing materials to manufacture yarns and then weaving the yarns. The glass filament can be a processed ore product composed mainly of silica. The core layer 110 maintains stiffness of the package substrate 100, and also serves as a base substrate on which the first and second metal line patterns 136 and 130 are formed. The core layer 110 includes a recess RS formed at its corner. The recess RS will be further described in detail below.

In an embodiment, the first metal line patterns 136 are disposed on the first surface 110a of the core layer 110, and the second metal line patterns 130 are disposed on the second surface 110b of the core layer 110. The vias 133 penetrate the core layer 110 and connect the first metal line patterns 136 to the second metal line patterns 130. The first metal line patterns 136, the second metal line patterns 130, and the vias 133 each include, for example, copper.

In an embodiment, the first metal line patterns 136 include first pads 134 and first wiring lines 135. The first pads 134 are connected to the vias 133 or the first wiring lines 135.

In an embodiment, the second metal line patterns 130 include second pads 132 and second wiring lines 131. The second pads 132 are connected to the vias 133 or the second wiring lines 131.

In an embodiment, the first solder resist layer 124 covers the first metal line patterns 136 and the first surface 110a of the core layer 110. The first solder resist layer 124 covers the first wiring lines 135 and selectively exposes the first pads 134.

In an embodiment, the second solder resist layer 122 covers the second metal line patterns 130 and the second surface 110b of the core layer 110. The second solder resist layer 122 covers the second wiring lines 131 and selectively exposes the second pads 132.

In an embodiment, the core layer 110 has a thickness greater than that of each of the first and second metal line patterns 136 and 130 and greater than that of each of the first and second solder resist layers 124 and 122. A double-sided PCB is depicted in the figures, but according to embodiments of the present inventive concepts, the package substrate 100 may include a multi-layered PCB or a single-sided PCB in which metal line patterns are formed on the first surface 110a of the core layer 110.

In an embodiment, the second pads 132 have external connection terminals 148 disposed thereon. The external connection terminals 148 may be, for example, solder balls.

In an embodiment, the semiconductor chip 210 has a first surface 210a and a second surface 210b that face each other. An adhesive layer 220 is disposed between the first solder resist layer 124 and the second surface 210b of the semiconductor chip 210. The semiconductor chip 210 is mounted by the adhesive layer 220 on the first surface 110a of the core layer 110.

In an embodiment, the semiconductor chip 210 includes chip pads 215 disposed on the first surface 210a. The chip pads 215 are electrically connected through bonding wires 230 to the first pads 134.

In an embodiment, the molding member 300 covers the semiconductor chip 210 and the first surface 110a of the core layer 110. The molding member 300 includes an epoxy molding compound (EMC). The molding member 300 includes a body 301 and a protrusion 302. The molding member 300 will be further described in detail below.

Figure 1C:
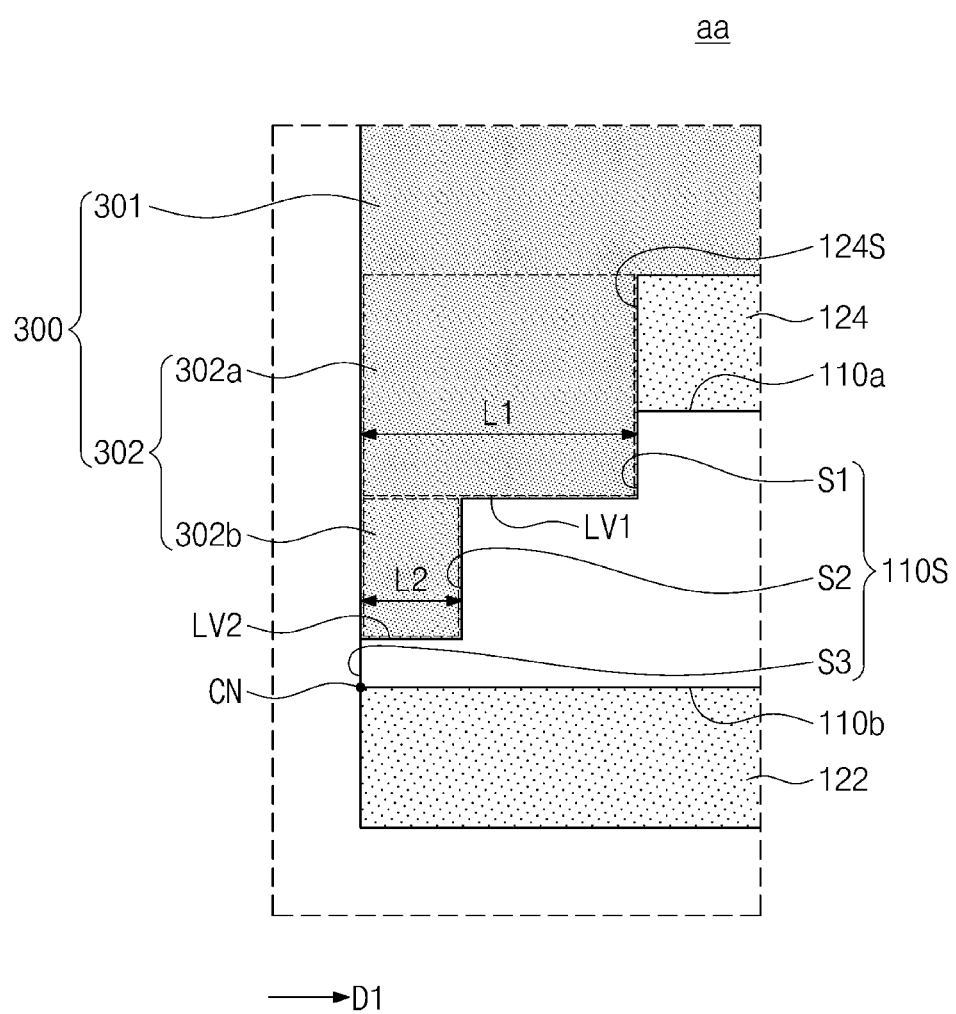
FIG. 1C is an enlarged view of section aa of FIG. 1B.

FIG. 1C is an enlarged view of section aa of FIG. 1B. Referring to FIGS. 1A to 1C, the core layer 110 includes the recess RS on each of four corners. The recess RS has a cross-section shaped like a staircase.

In an embodiment, the core layer 110 has on its corner a step structure between the first surface 110a and the second surface 110b. The thickness of the core layer 110 is less at the corner than at other portions.

In an embodiment, the core layer 110 has on its edge an outer wall 110S that includes a first segment S1, a second segment S2, and a third segment S3. The first segment S1 of the outer wall 110S is connected to the first surface 110a of the core layer 110. The second segment S2 of the outer wall 110S is located lower than the first segment S1, and is spaced apart in the first direction D1 or the second direction D2 from the first segment S1. The second segment S2 is parallel to the first segment S1. The first and second segments S1 and S2 of the outer wall 110S are connected to each other through a first bottom surface LV1 of the core layer 110, and form a step structure. The first bottom surface LV1 is positioned between and parallel to the first and second surfaces 110a and 110b of the core layer 110.

In an embodiment, the third segment S3 of the outer wall 110S is located lower than the second segment S2, and is spaced apart in the first direction D1 or the second direction D2 from the second segment S2. The third segment S3 of the outer wall 110S is connected to the second surface 110b of the core layer 110. The third segment S3 of the outer wall 110S is coplanar with a lateral surface 300S of the molding member 300, and is parallel to the second segment S2. The second and third segments S2 and S3 of the outer wall 110S are connected to each other through a second bottom surface LV2 of the core layer 110, and form a step structure. The second bottom surface LV2 is positioned between the first bottom surface LV1 and the second surface 110b of the core layer 110, and is parallel to the second surface 110b of the core layer 110.

In an embodiment, each of the recesses RS includes a first recess part R1 and a second recess part R2 below the first recess part R1. The first and second recess parts R1 and R2 overlap each other in the vicinity of vertices CN on the second surface 110b of the core layer 110. The first recess part R1 and the second recess part R2 each have an inner wall and a bottom surface.

In an embodiment, the inner wall of the first recess part R1 corresponds to an outer surface 124S of the first solder resist layer 124 and the first segment S1 of the outer wall 110S, and the bottom surface of the first recess part R1 corresponds to the first bottom surface LV1. For example, the first recess part R1 can be defined by the outer surface 124S of the first solder resist layer 124, the first segment S1 of the outer wall 110S, and the first bottom surface LV1.

In an embodiment, the inner wall of the second recess part R2 corresponds to the second segment S2 of the outer wall 110S of the core layer 110, and the bottom surface of the second recess part R2 corresponds to the second bottom surface LV2. For example, the second recess part R2 can be defined by the second segment S2 of the outer wall 110S and the second bottom surface LV2.

In an embodiment, a portion of the first recess part R1 extends along the first direction D1 from one of the vertices CN of the core layer 110. A remaining portion of the first recess part R1 extends along the second direction D2 from the corresponding vertex CN of the core layer 110. For example, the first recess part R1 has an "L" shape when viewed in plan.

In an embodiment, on the edge of the core layer 110, the molding member 300 penetrates at least a portion of the core layer 110. The molding member 300 includes a body 301 on a top surface of the first solder resist layer 124 and protrusions 302 between the top surface of the first solder resist layer 124 and the second surface 110b of the core layer 110. The protrusions 302 fill the corresponding recesses RS. A bottom surface of the protrusion 302 is spaced apart in the third direction D3 from the second surface 110b of the core layer 110 and corresponds to the second bottom surface LV2. The second surface of the of the core layer 110 has a tetragonal shape when viewed in a plan view.

In an embodiment, the protrusion 302 is integrally connected to the body 301. The protrusion 302 includes a first part 302a that is connected to a bottom end of the body 301 and a second part 302b that extends from the first part 302a toward the second surface 110b of the core layer 110. The second part 302b of the protrusion 302 fills the second recess part R2, and the first part 302a of the protrusion 302 fills the first recess part R1.

In an embodiment, the first part 302a of the protrusion 302 has an "L" shape when viewed in a plan view. For example, a portion of the first part 302a extends in the first direction D1 inside a first portion of the first recess part R1, and a remaining portion of the first part 302a extends in the second direction D2 inside a second portion of the first recess part R1. A corner of the "L" shape corresponds to the vertex CN on the second surface 110b of the core layer 110.

In an embodiment, the second part 302b of the protrusion 302 is positioned on a corresponding vertex CN on the second surface 110b of the core layer 110. The second part 302b of the protrusion 302 may have a square pillar shape or a cylindrical pillar shape.

In an embodiment, the first part 302a of the protrusion 302 has a bottom surface at the same level as that of the first bottom surface LV1. The second part 302b of the protrusion 302 has a bottom surface at the same level as that of the second bottom surface LV2. A spacing distance between the bottom surface of the first part 302a of the protrusion 302 and the second surface 110b of the core layer 110 is greater than that between the bottom surface of the second part 302b of the protrusion 302 and the second surface 110b of the core layer 110.

In an embodiment, the first part 302a of the protrusion 302 has a first width L1 in the first direction D1. The second part 302b of the protrusion 302 has a second width L2 in the first direction D1. The second width W2 is less than the first width W1.

When the semiconductor package 10 is subject to a subsequent process or an operation thereof, the semiconductor package 10 may experience warpage caused by a difference between the coefficients of thermal expansion (CTE) of the semiconductor chip 210 and the package substrate 100. The warpage magnitude at a center of the package substrate 100 may differ from that at an edge of the package substrate 100. According to an embodiment of the present inventive concepts, as the recess RS is formed on the edge of the core layer 110 and is filled with the molding member 300, a reduction in warpage can be achieved between the center and the edge of the package substrate 100. For example, the core layer 110 has a thin region at the edge thereof, and the molding member 300 fills the thin region, with the result that the molding member 300 can prevent warpage of the edge of the core layer 110.

FIGS. 2A, 3A, 4A, 5A, 6A, and 7A are plan views that illustrate a method of fabricating a semiconductor package of FIG. 1A. FIGS. 2B, 3B, 4B, 5B, 6B, and 7B are cross-sectional views taken along line I-I' of FIGS. 2A, 3A, 4A, 5A, 6A, and 7A, respectively. FIGS. 2C, 3C, and 4C are enlarged views of, respectively, sections bb, cc, and dd of FIGS. 2A, 3A, and 4A.

A repeated description of components described with reference to FIGS. 1A to 1C will be omitted, except for those described below.

Figure 2A:
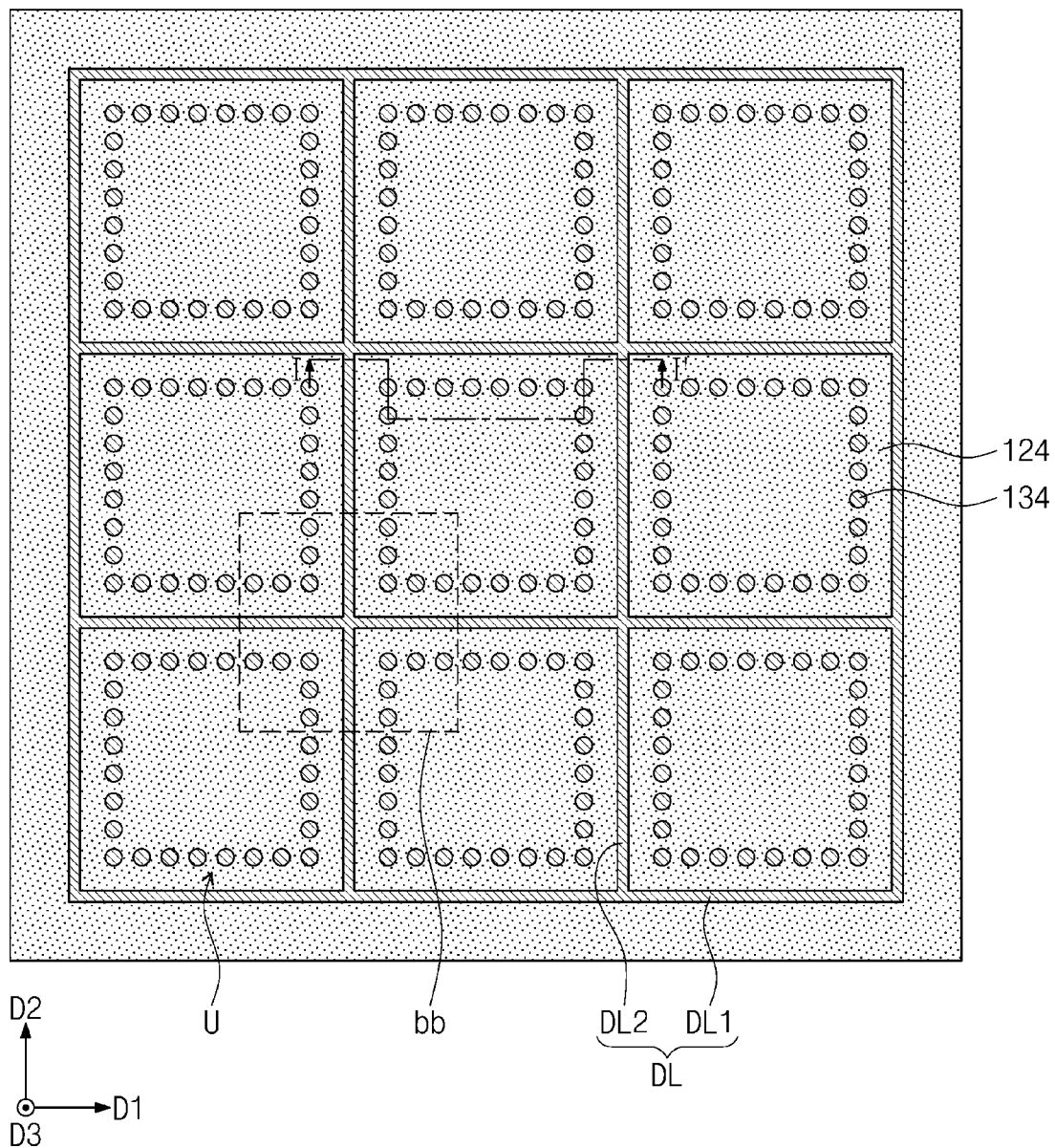
FIGS. 2A, 3A, 4A, 5A, 6A, and 7A are plan views that illustrate a method of fabricating a semiconductor package of FIG. 1A.
Figure 2B:
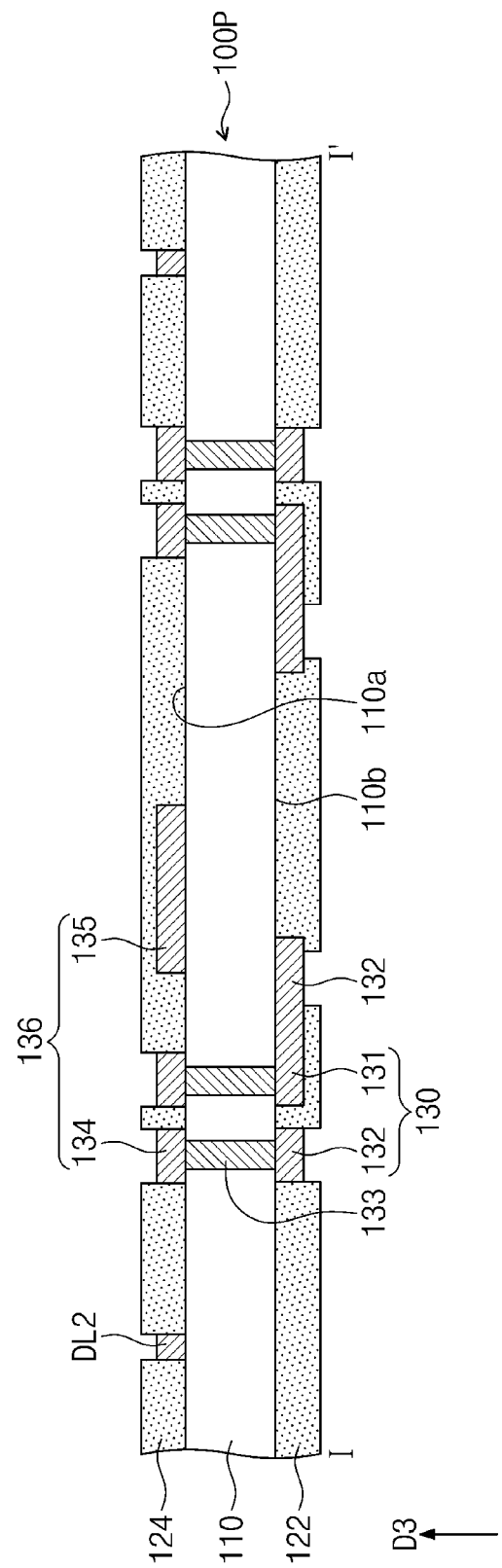
FIGS. 2B, 3B, 4B, 5B, 6B, and 7B are cross-sectional views taken along line I-I' of FIGS. 2A, 3A, 4A, 5A, 6A, and 7A, respectively.
Figure 2C:
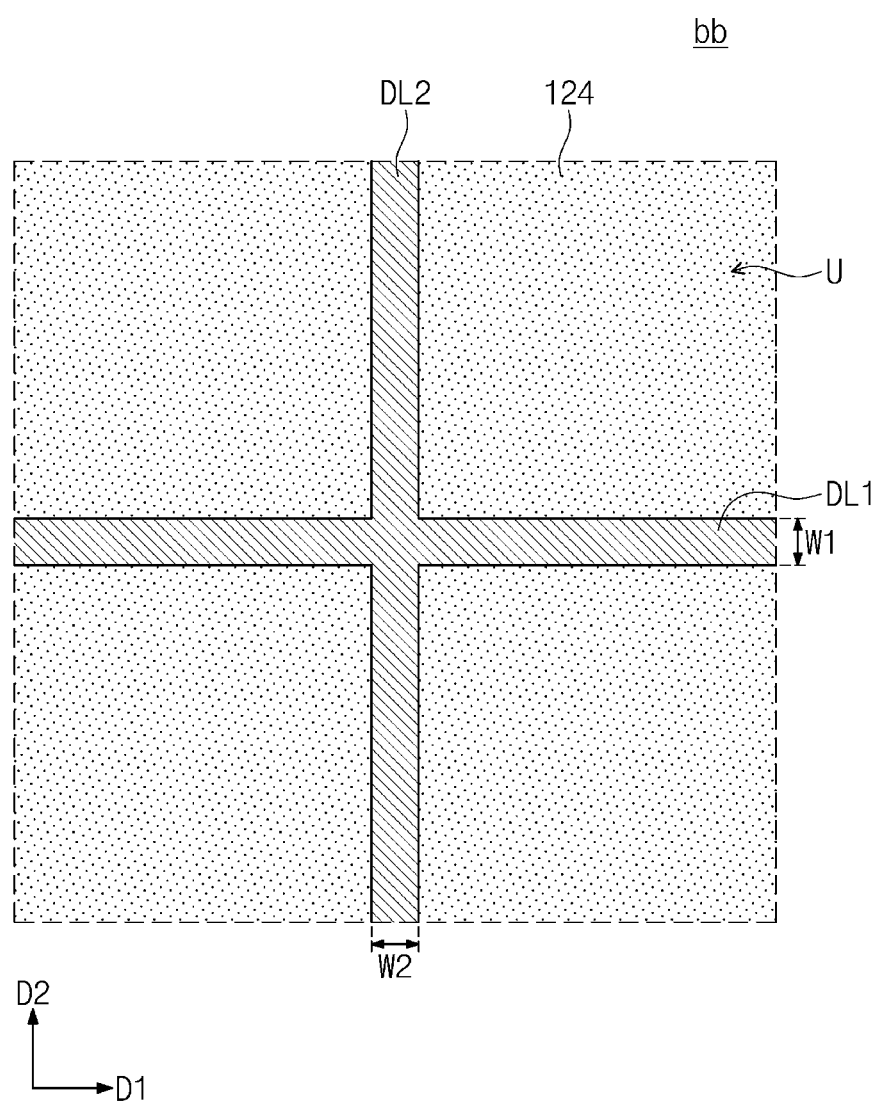
FIGS. 2C, 3C, and 4C are enlarged views of, respectively, sections bb, cc, and dd of FIGS. 2A, 3A, and 4A.

Referring to FIGS. 2A and 2B, in an embodiment, a printed circuit board structure 100P is provided which includes a plurality of units U. Each unit U includes the core layer 110, the first and second metal line patterns 136 and 130, the first and second solder resist layers 124 and 126, and the vias 133. Through a trench formation and a sawing process which will be described below, each of the units U is formed into the package substrate 100 of FIG. 1A.

In an embodiment, the printed circuit board structure 100P further includes a dummy line structure DL on the first surface 110a of the core layer 110. The dummy line structure DL is exposed by the first solder resist layer 124. The dummy line structure DL includes, for example, copper. The dummy line structure DL includes first dummy lines DL1 that extend along the first direction D1, and second dummy lines DL2 that intersect the first dummy lines DL1 and extend along the second direction D2. The first and second dummy lines DL1 and DL2 correspond to sawing lines. The first and second dummy lines DL1 and DL2 distinguish the units U from each other.

FIG. 2C is an enlarged view of FIG. 2A. For clarity iof illustration, FIG. 2C omits the first pads 134 shown in FIG. 2A. Referring to FIGS. 2A and 2C, four units U are adjacent to each other across the first dummy line DL1 and the second dummy line DL2. Each of the units U has a tetragonal shape when viewed in plan, and a vertex close to an intersection between the first dummy line DL1 and the second dummy line DL2.

In an embodiment, each of the first dummy lines DL1 has a first width W1 of about 0.1 mm to about 0.3 mm in the second direction D2, and each of the second dummy lines DL2 has a second width W2 of about 0.1 mm to about 0.3 mm in the first direction D1. For example, each of the first and second widths W1 and W2 are about 0.2 mm. The first width W1 in the second direction D2 of the first dummy lines DL1 is substantially the same as the second width W2 in the first direction D1 of the second dummy lines DL2.

Figure 3A:
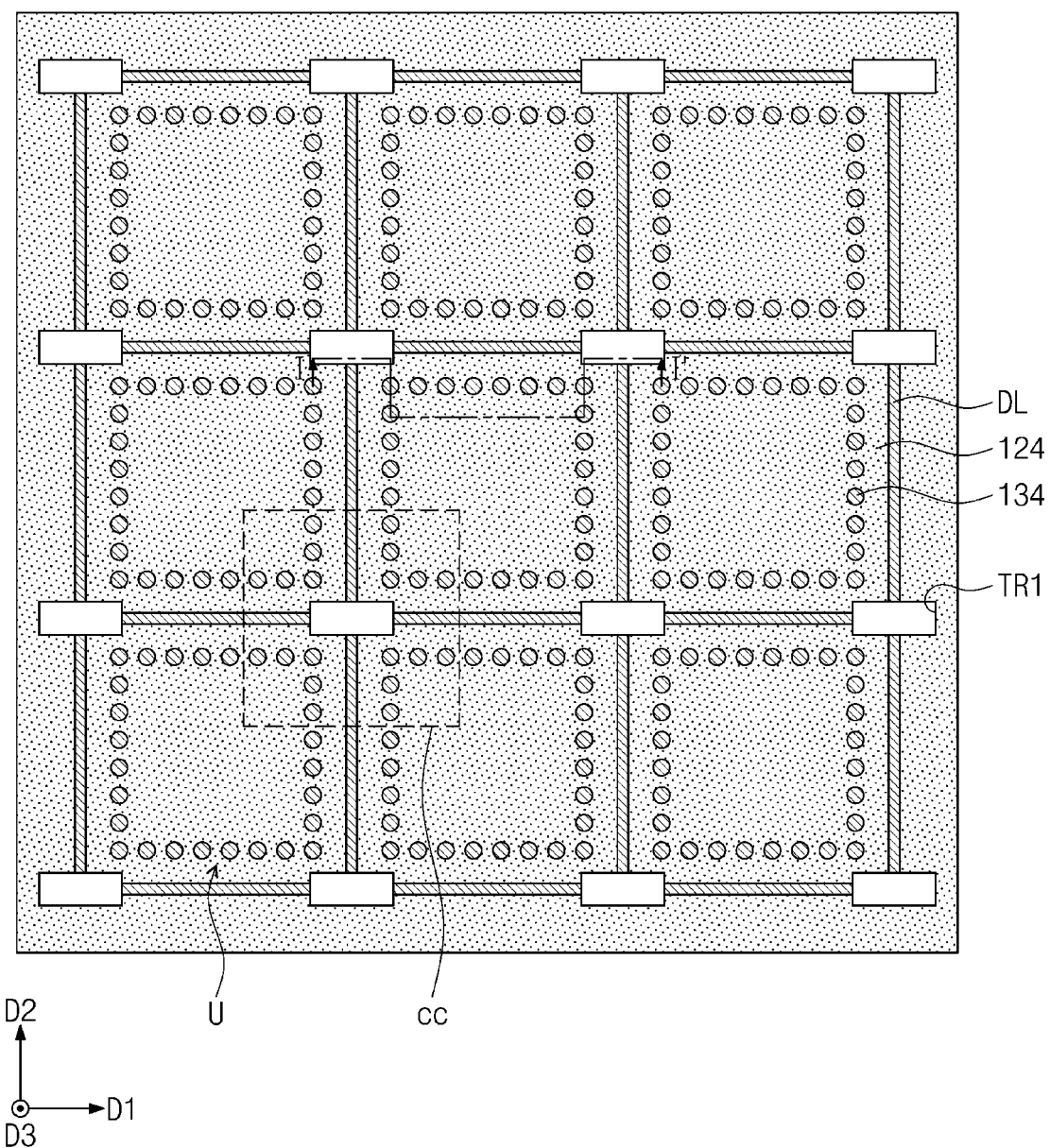
Figure 3B:
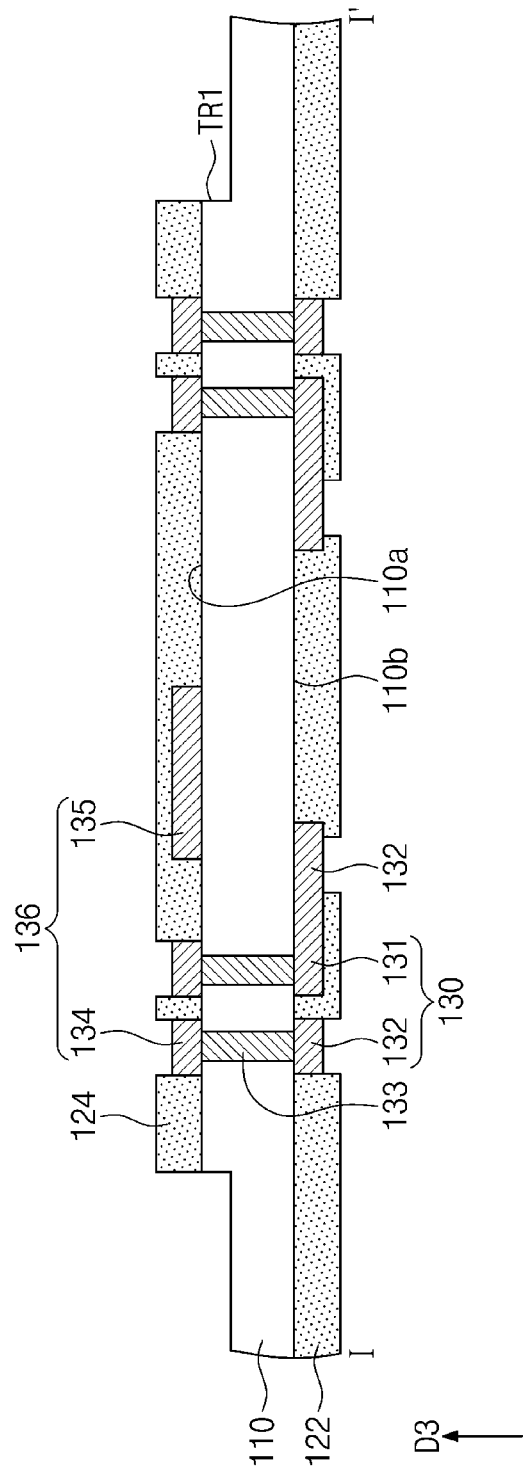
Figure 3C:
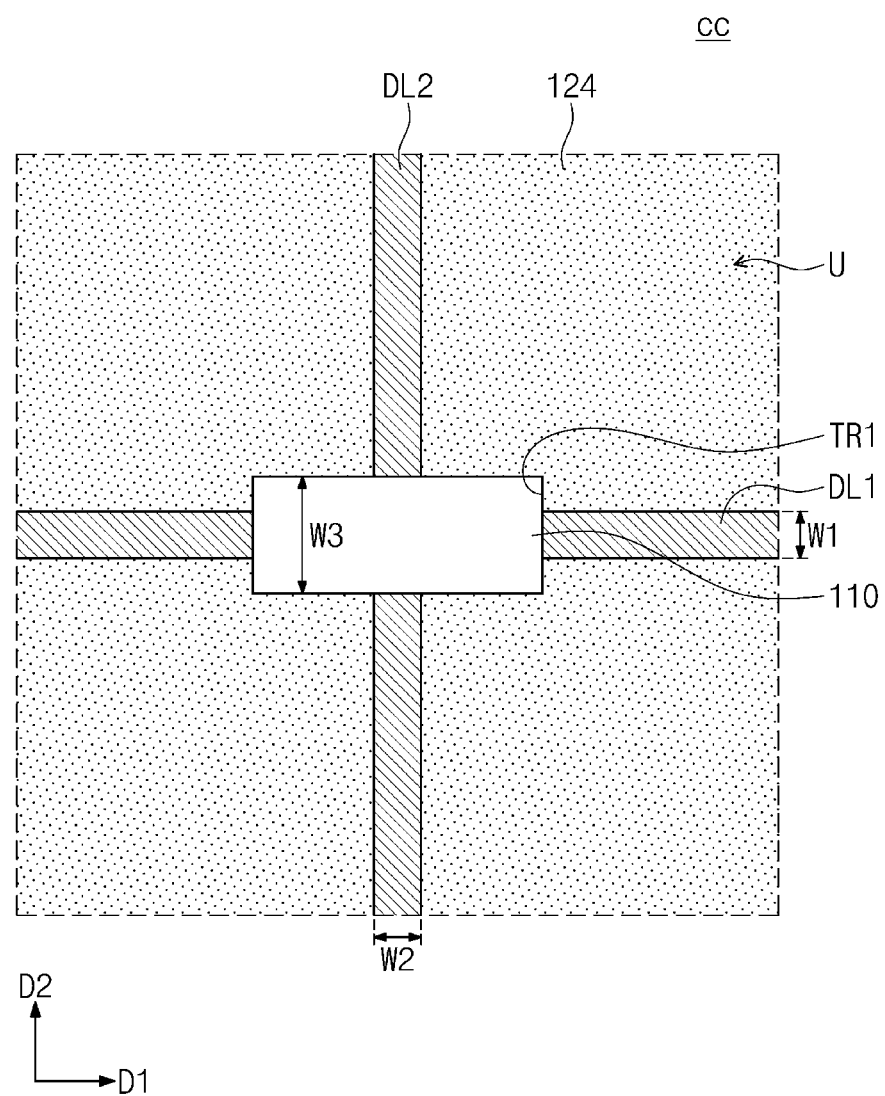

Referring to FIGS. 3A and 3B, first trenches TR1 are formed at intersections between the first dummy line DL1 and the second dummy line DL2. The first trenches TR1 are formed at vertices and the surrounding edges of the units U. The first dummy lines DL1, the second dummy lines DL2, the first solder resist layer 124, and the core layer 110 around the vertices of the units U are partially removed during the formation of the first trenches TR1. The first trenches TR1 can be formed by using, for example, a laser drilling process. The formation of the first trenches TR1 exposes a top surface of the core layer 110 in the vicinity of each vertex of the units U. The top surface of the core layer 110 is exposed in a bar shape when viewed in plan.

FIG. 3C is an enlarged view of FIG. 3A. For clarity of illustration, FIG. 3C omits the first pads 134 shown in FIG. 3A.

Referring to FIGS. 3A and 3C, in an embodiment, the first trench TR1 has a third width W3 in the second direction D2. The third width W3 of the first trench TR1 is greater than the first width W1 of the first dummy line DL1. The third width W3 ranges from about 0.3 mm to about 5 mm. For example, the third width W3 is about 0.3 mm.

Figure 4A:
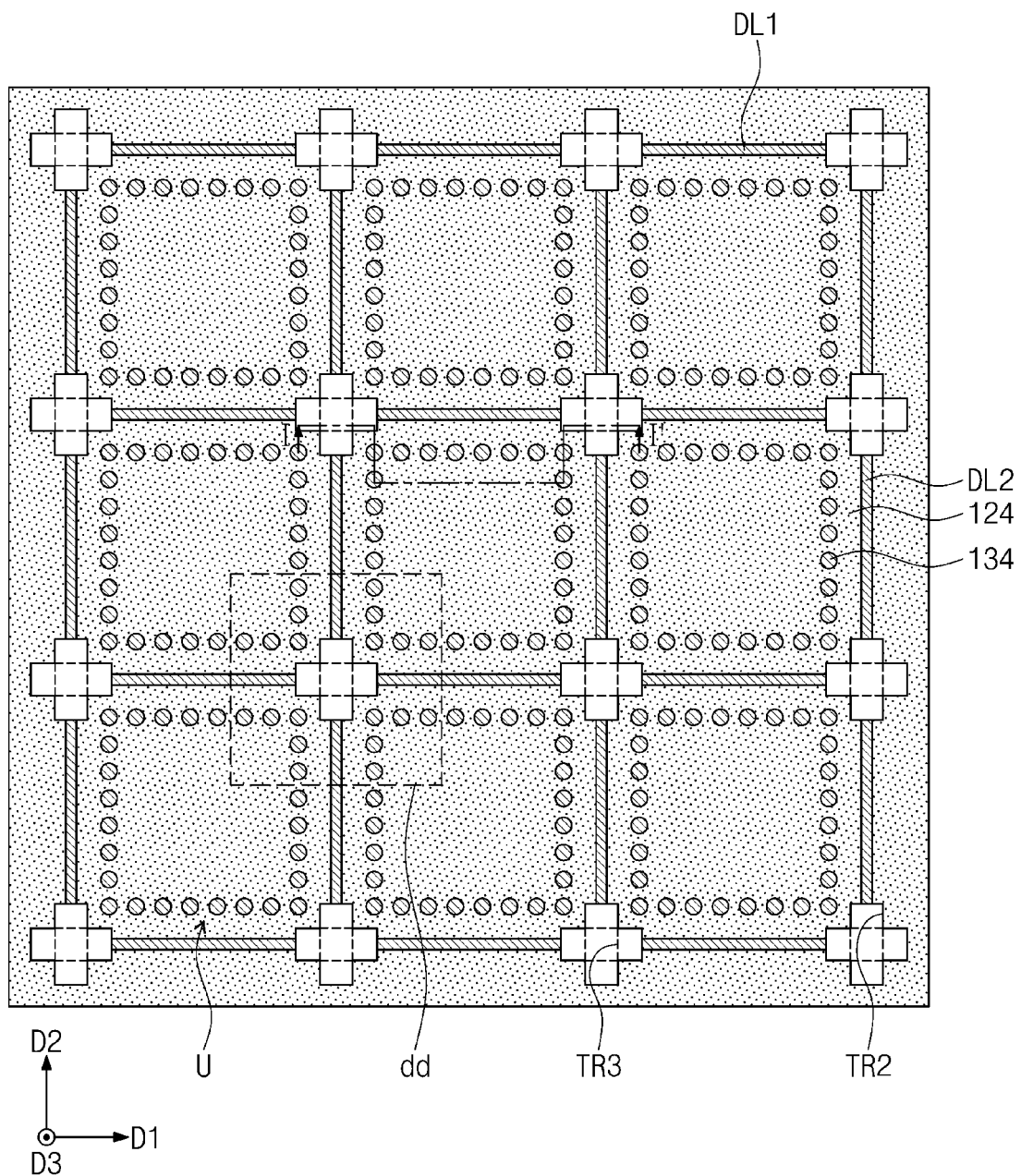
Figure 4B:
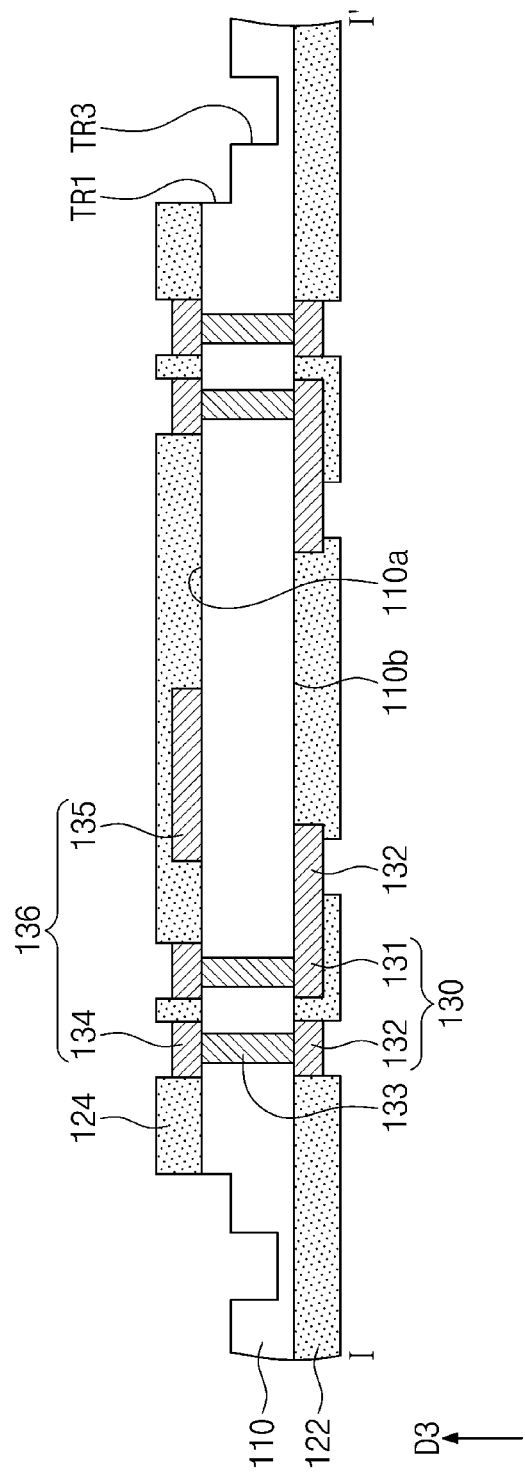
Figure 4C:
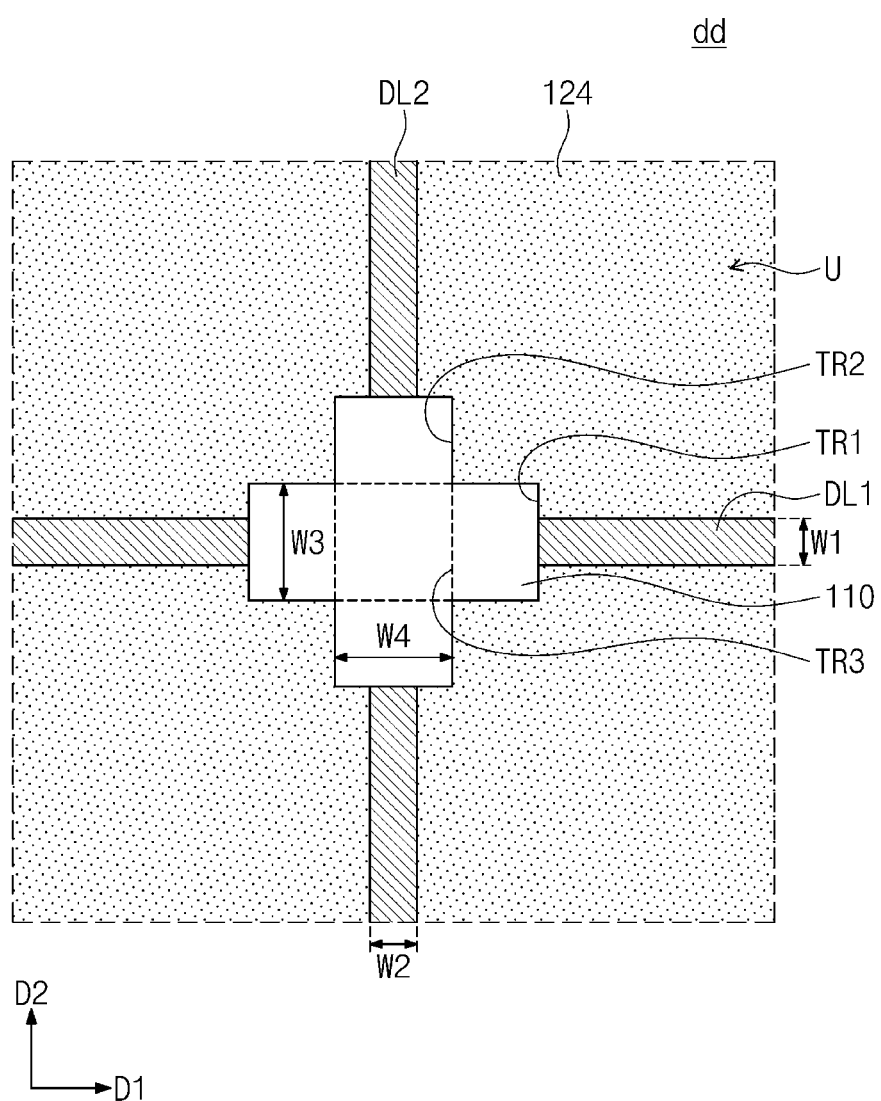

Referring to FIGS. 4A and 4B, in an embodiment, second trenches TR2 are formed at the vertices and the surrounding edges of the units U. The second trenches TR2 extend in the second direction D2.

In an embodiment, the second dummy lines DL2, the first solder resist layer 124, and the core layer 110 around the vertices of the units U are partially removed during the formation of the second trenches TR2.

In an embodiment, the second trenches TR2 can be formed by using, for example, a laser drilling process. When the second trenches TR2 are formed, third trenches TR3 are formed on the vertices of the units U that overlap centers of the first trenches TR1. The third trench TR3 has a bottom surface that is lower than those of the first and second trenches TR1 and TR2. The top surface of the core layer 110 is exposed in a cross shape when viewed in plan.

FIG. 4C is an enlarged view of FIG. 4A. For clarity of illustration, FIG. 4C omits the first pads 134 shown in FIG. 4A. Referring to FIGS. 4A and 4C, in an embodiment, the second trench TR2 have a fourth width W4 in the first direction D1. The fourth width W4 of the second trench TR2 is greater than the second width W2 of the second dummy line DL2. The fourth width W4 ranges from about 0.3 mm to about 5 mm. For example, the fourth width W4 may be about 0.3 mm. In an embodiment, the third width W3 in the second direction D2 of the first trench TR1 is substantially the same as the fourth width W4 in the first direction D1 of the second trench TR2.

Figure 5A:
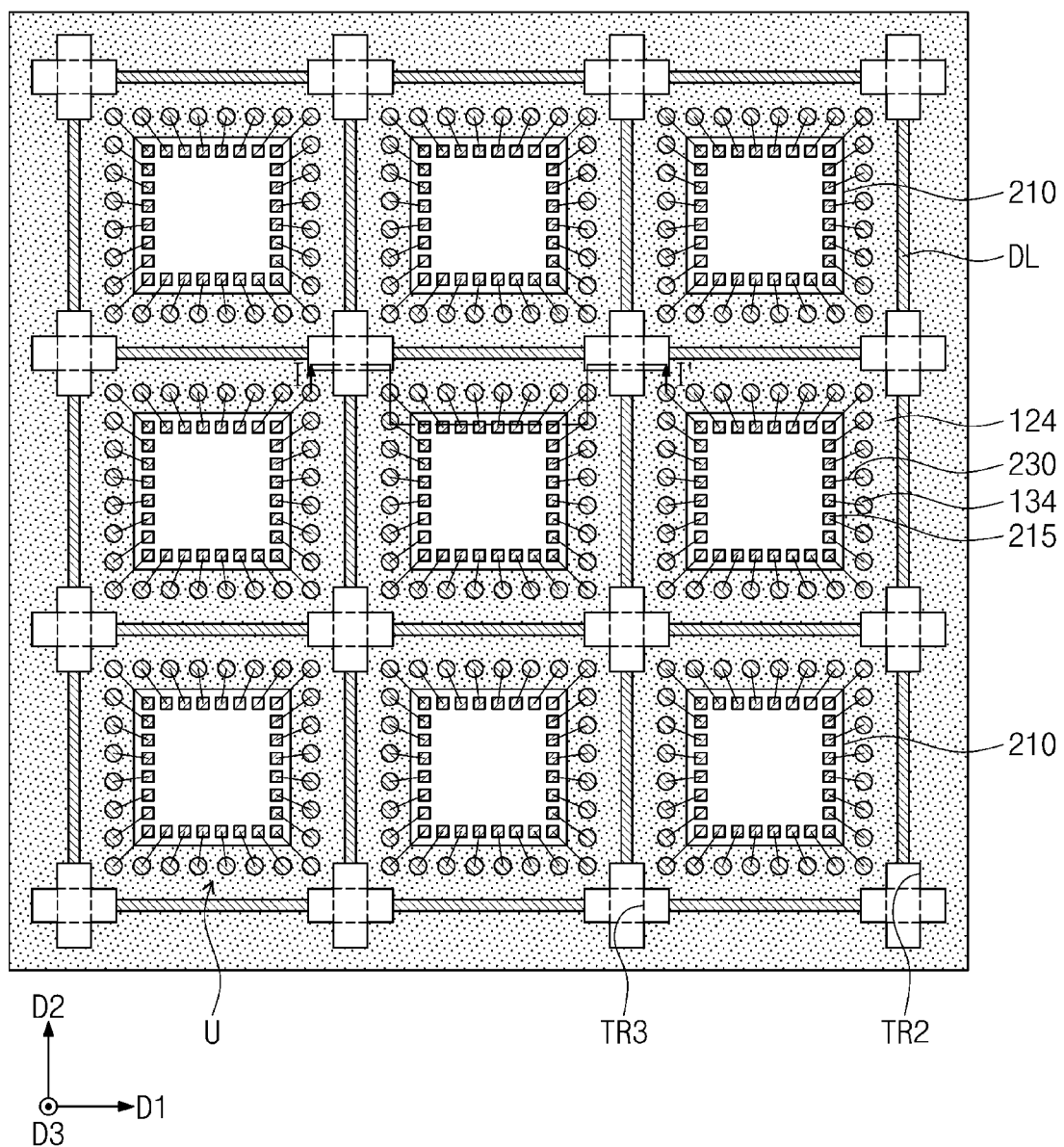
Figure 5B:
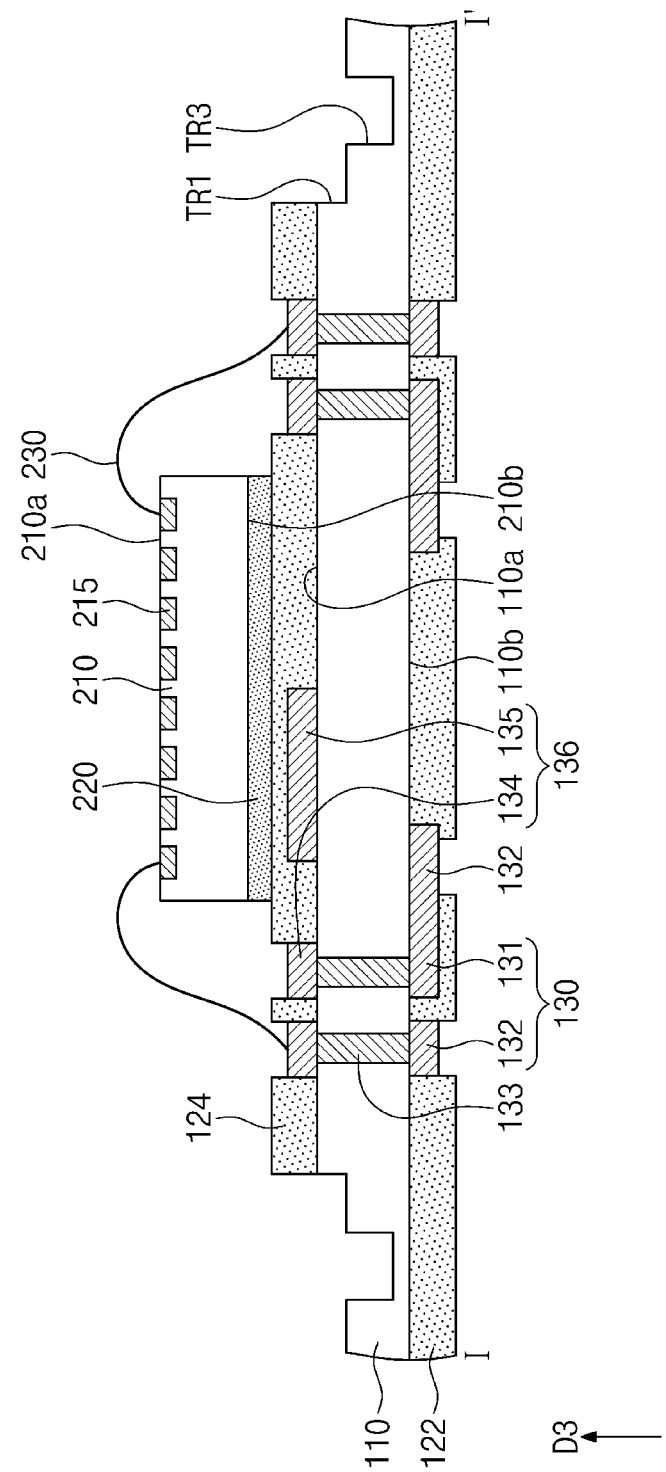

Referring to FIGS. 5A and 5B, in an embodiment, semiconductor chips 210 are mounted on the core layer 110. For example, the semiconductor chips 210 may be mounted in a wire bonding manner.

Figure 6A:
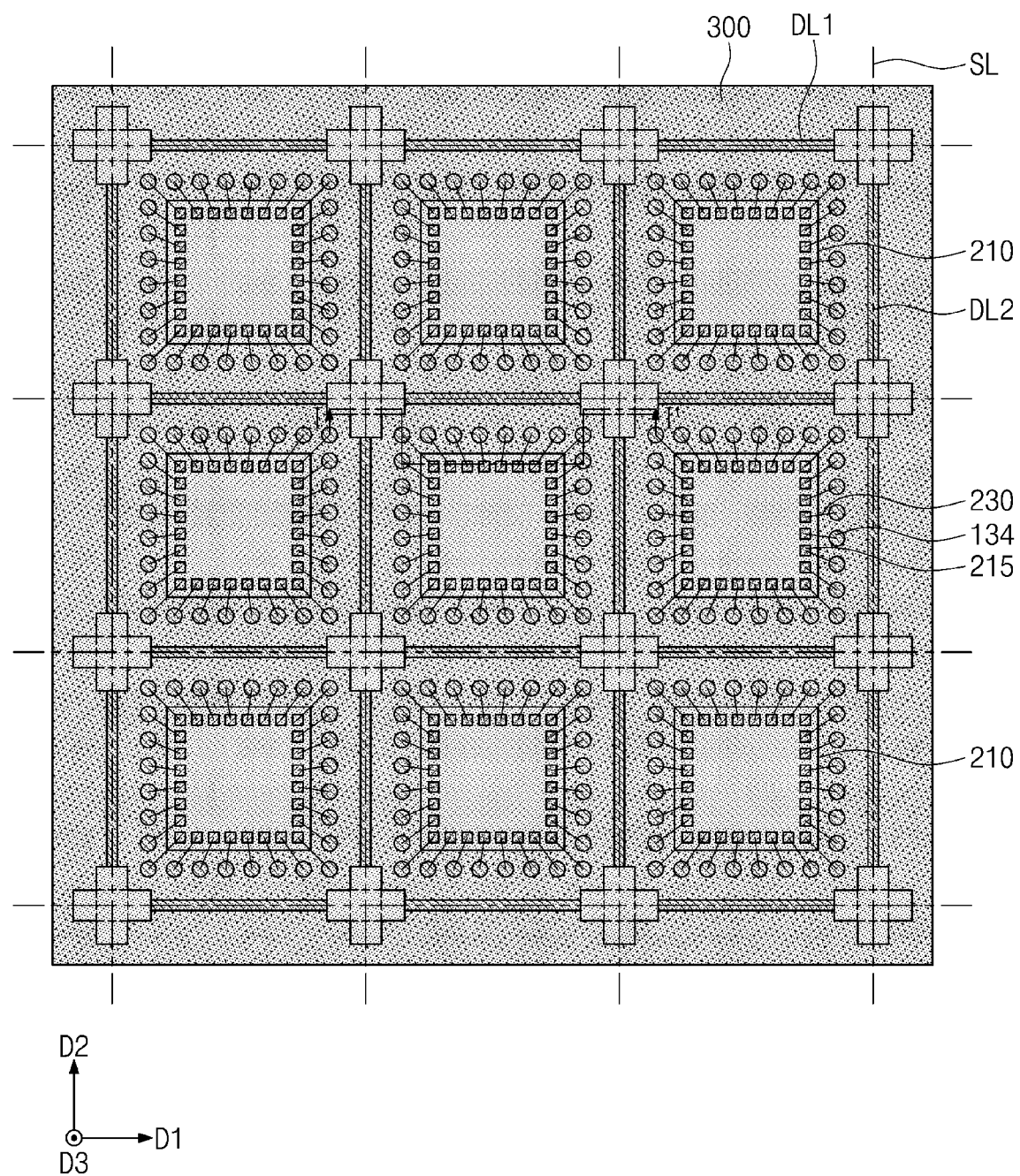
Figure 6B:
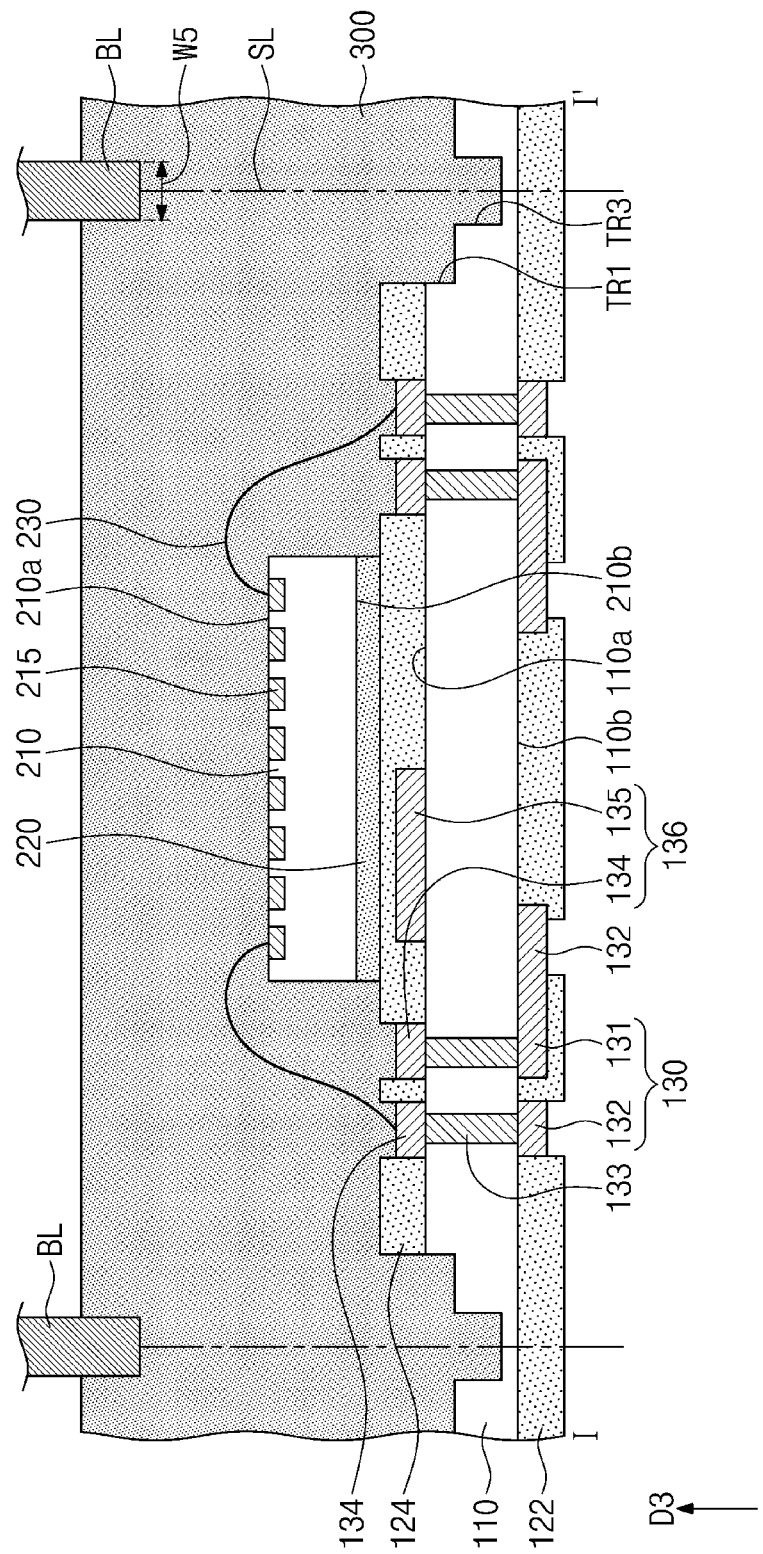

Referring to FIGS. 6A and 6B, in an embodiment, a molding member 300 is formed that covers the semiconductor chips 210 and the first surface 110a of the core layer 110. The molding member 300 fills the first trench TR1, the second trench TR2, and the third trench TR3. Afterwards, a sawing process is performed along sawing lines SL that overlap the first and second dummy lines DL1 and DL2. The sawing process may include, for example, a blade sawing process. The blade sawing process cuts the molding member 300, the core layer 110, and the second solder resist layer 122. A blade BL has a width W5 substantially the same as or greater than the first width W1 of the first dummy line DL1 and the second width W2 of the second dummy line DL2. The first and second dummy lines DL1 and DL2 are all removed in the sawing process. The width W5 of the blade BL is less than the third width W3 of the first trench TR1 and the fourth width W4 of the second trench TR2.

Figure 7A:
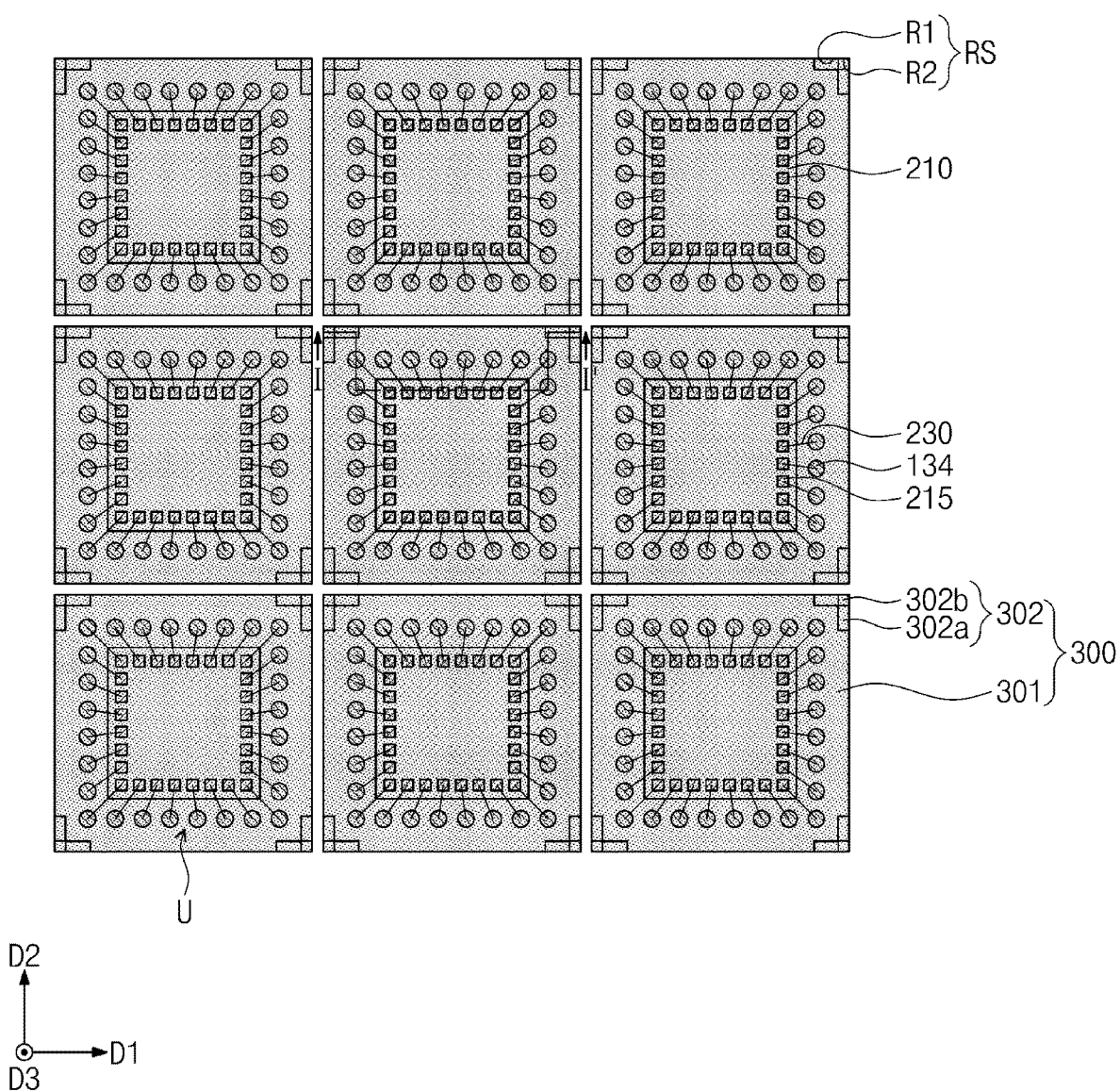
Figure 7B:
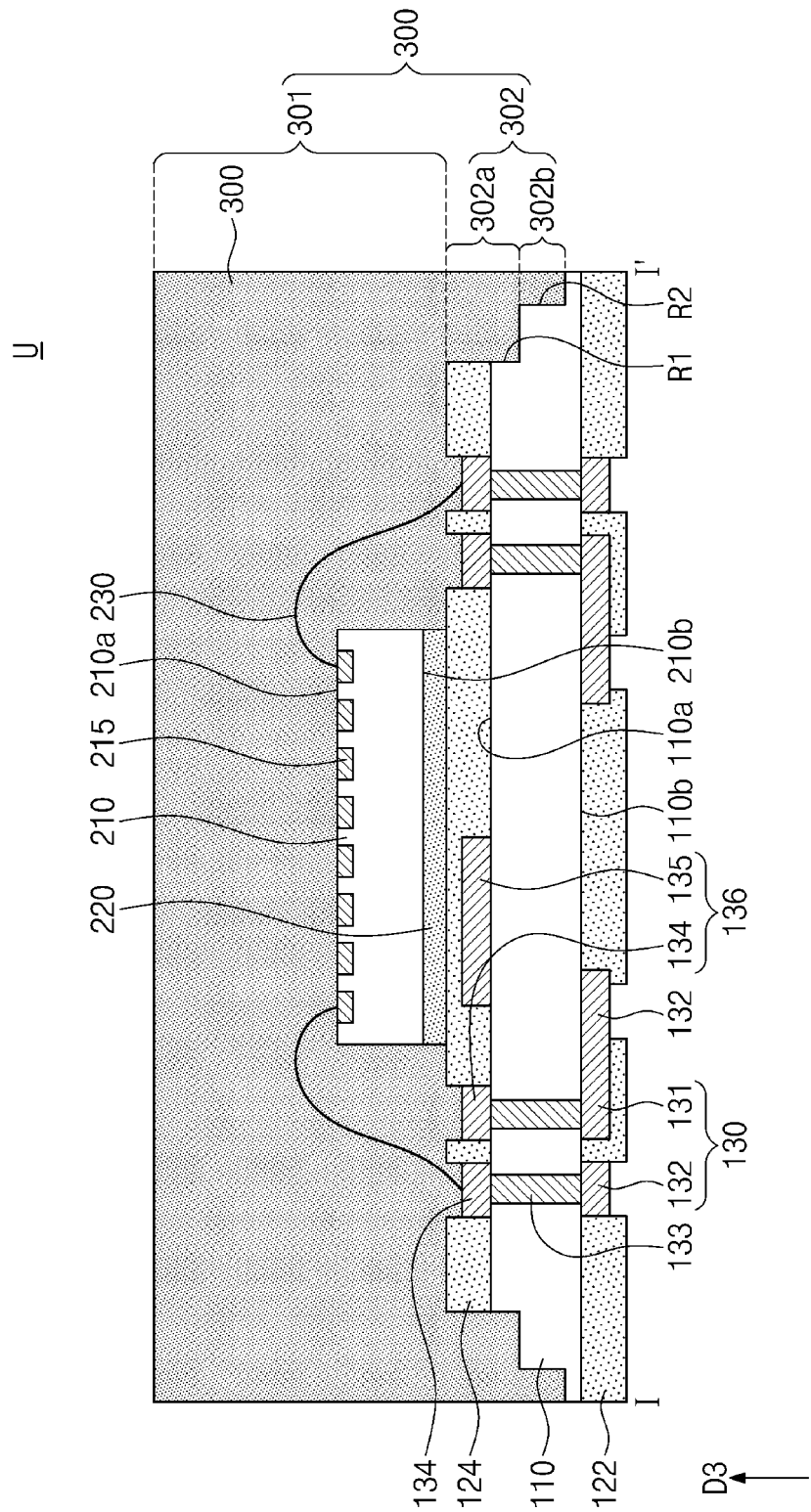

Referring to FIGS. 7A and 7B, the sawing process separates individual units of the plurality of units U from each other. In the sawing process, the first, second, and third trenches TR1, TR2, and TR3 are formed into recesses RS. After the sawing process, the first trench TR1 and the second trench TR2 constitute a first recess part R1. After the sawing process, the third trench TR3 constitutes a second recess part R2. The molding member 300 that fills the first, second, and third trenches TR1, TR2, and TR3 constitutes a protrusion 302 that includes a first part 302a that fills the first recess part R1 and a second part 302b that fills the second recess part R2.

Warpage may occur caused by differences between the coefficients of thermal expansion (CTE) of the printed circuit board structure 100P and the semiconductor chips 210. Warpage may asymmetrically occur on the printed circuit board structure 100P, and there may be a large difference in warpage magnitude between the edge and central portions of the printed circuit board structure 100P.

According to embodiments of the present inventive concepts, the printed circuit board structure 100P includes the trenches TR1 to TR3 formed on the dummy line structure DL that overlaps the sawing lines SL. In this case, the trenches TR1 to TR3 in the printed circuit board structure 100P cause warpage to independently occur at each unit U. As a result, it may be possible to reduce an overall warpage magnitude of the printed circuit board structure 100P.

Referring to FIGS. 1A and 1B, in an embodiment, external connection terminals 148 are attached to corresponding second pads 132, and thus the unit U is formed into a semiconductor package 10. According to some embodiments, before the sawing process is performed, the external connection terminals 148 are attached to corresponding second pads 132.

Figure 8:
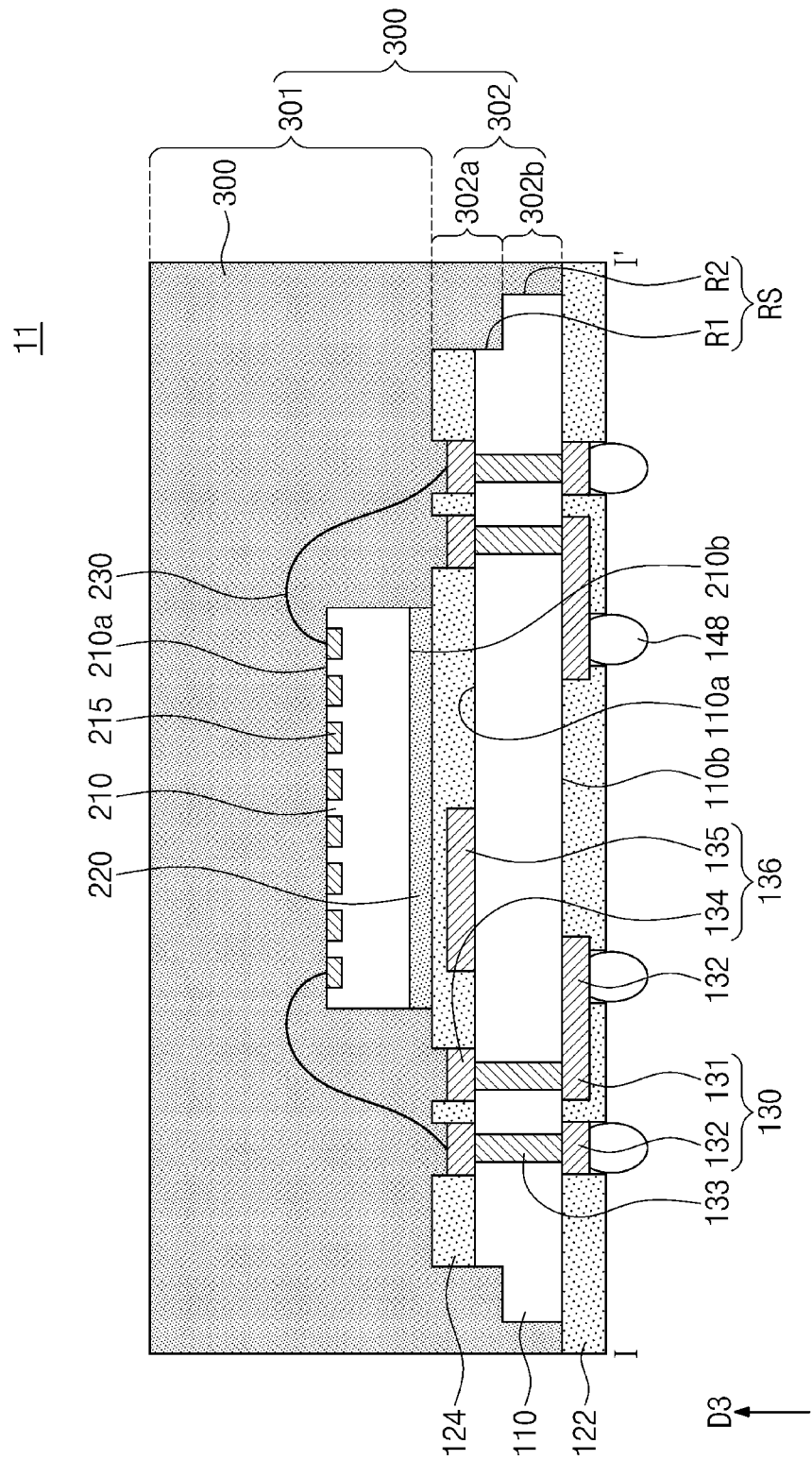
FIG. 8 is a cross-sectional view taken along line I-I' of FIG. 1A.

FIG. 8 is a cross-sectional view taken along line I-I' of FIG. 1A. A repeated description of components described with reference to FIGS. 1A and 1B will be omitted, except for those described below. Referring to FIG. 8, a semiconductor package 11 according to some embodiments may include the protrusion 302 that penetrates the core layer 110.

In an embodiment, the second part 302b of the protrusion 302 contacts the second solder resist layer 122. According to some embodiments, the second part 302b of the protrusion 302 extends along the third direction D3 and exposes the second solder resist layer 122.

Figure 9:
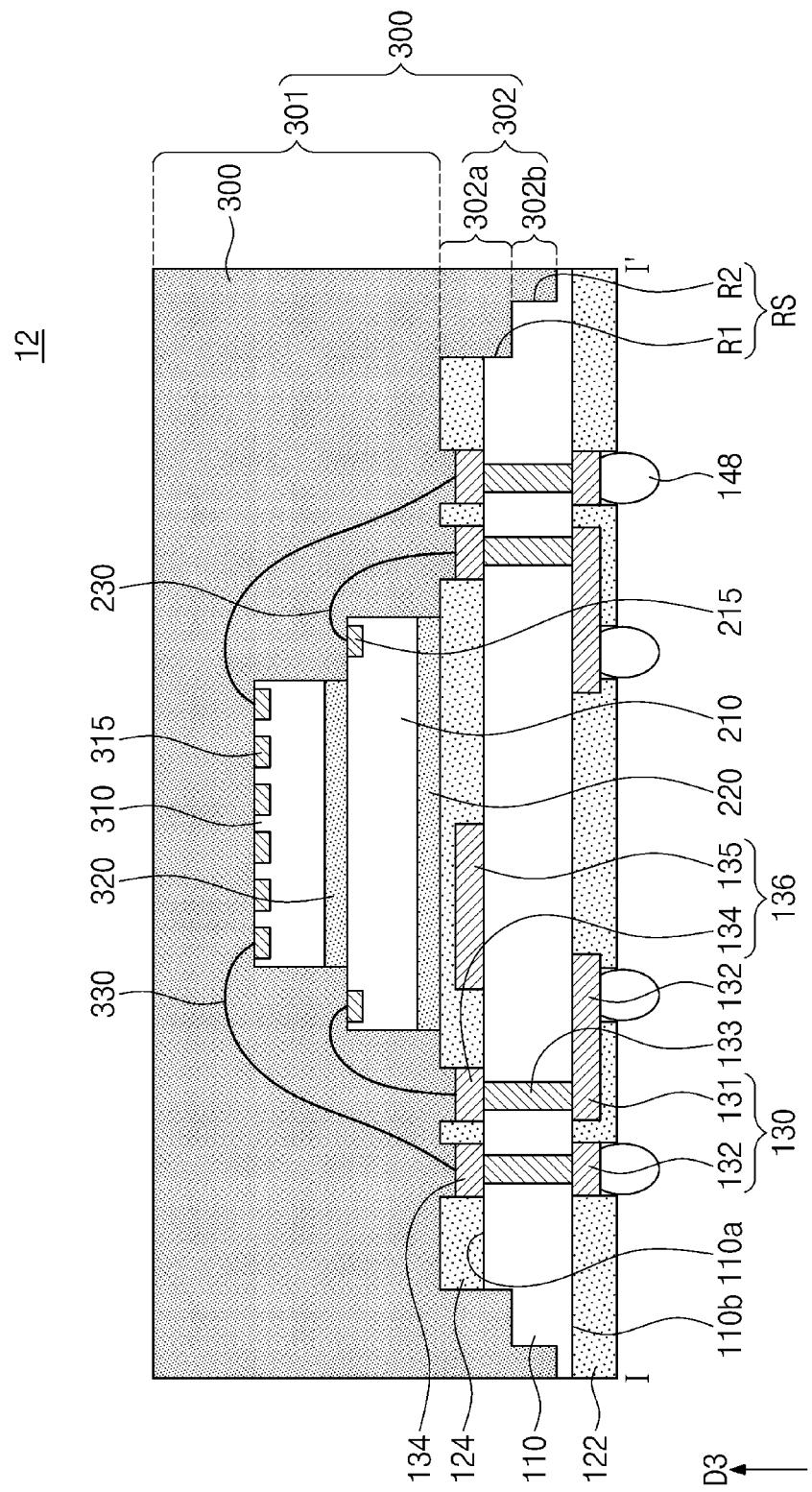
FIG. 9 is a cross-sectional view taken along line I-I' of FIG. 1A.

FIG. 9 illustrates a cross-sectional view taken along line I-I' of FIG. 1A. A repeated description of components described with reference to with FIGS. 1A and 1B will be omitted, except for those described below. Referring to FIG. 9, a semiconductor package 12 according to some embodiments includes a plurality of stacked semiconductor chips 210 and 310.

For example, in an embodiment, a second semiconductor chip 310 is disposed on a first semiconductor chip 210. The first semiconductor chip 210 is mounted through a first adhesive layer 220 on the core layer 110. A second adhesive layer 320 is disposed between the second semiconductor chip 310 and the first semiconductor chip 210. The second semiconductor chip 310 is attached to the first semiconductor chip 210 by the second adhesive layer 320.

In an embodiment, the first semiconductor chip 210 includes first chip pads 215 provided on a top surface thereof. The second semiconductor chip 310 includes second chip pads 315 provided on a top surface thereof. The first chip pads 215 and the second chip pads 315 are electrically connected through bonding wires 230 and 330, respectively, to the first pads 134.

Figure 10:
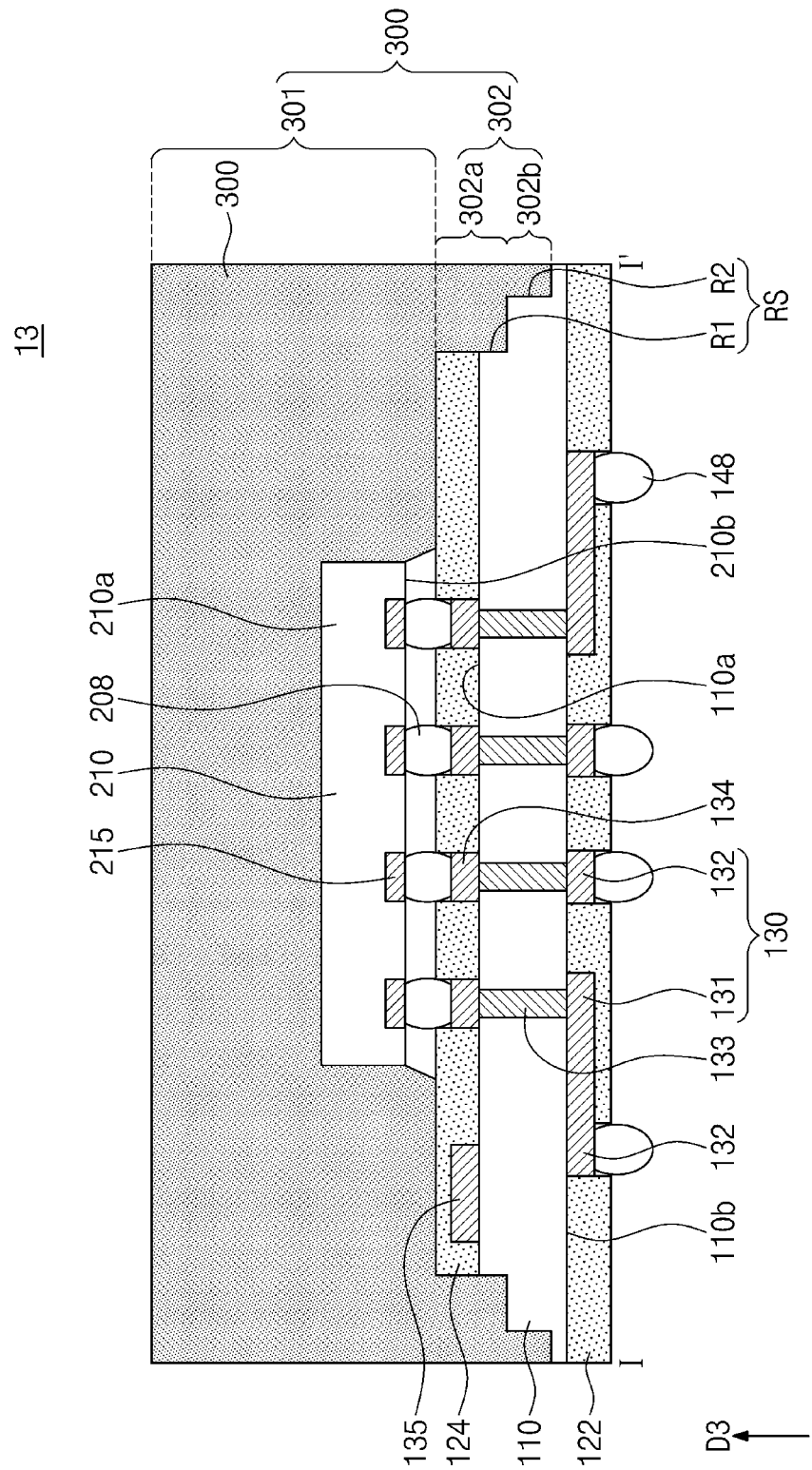
FIG. 10 is a cross-sectional view of a semiconductor package according to some embodiments of the present inventive concepts.

FIG. 10 is a cross-sectional view of a semiconductor package 13 according to some embodiments. A repeated description of components described with reference to FIGS. 1A and 1B will be omitted, except for those described below. Referring to FIG. 10, the chip pads 215 are disposed on the second surface 210b of the semiconductor chip 210. For example, the chip pads 215 are electrically connected through bumps 208 to the first pads 134. In this case, the semiconductor chip 210 is flip-chip mounted on the core layer 110.

Figure 11:
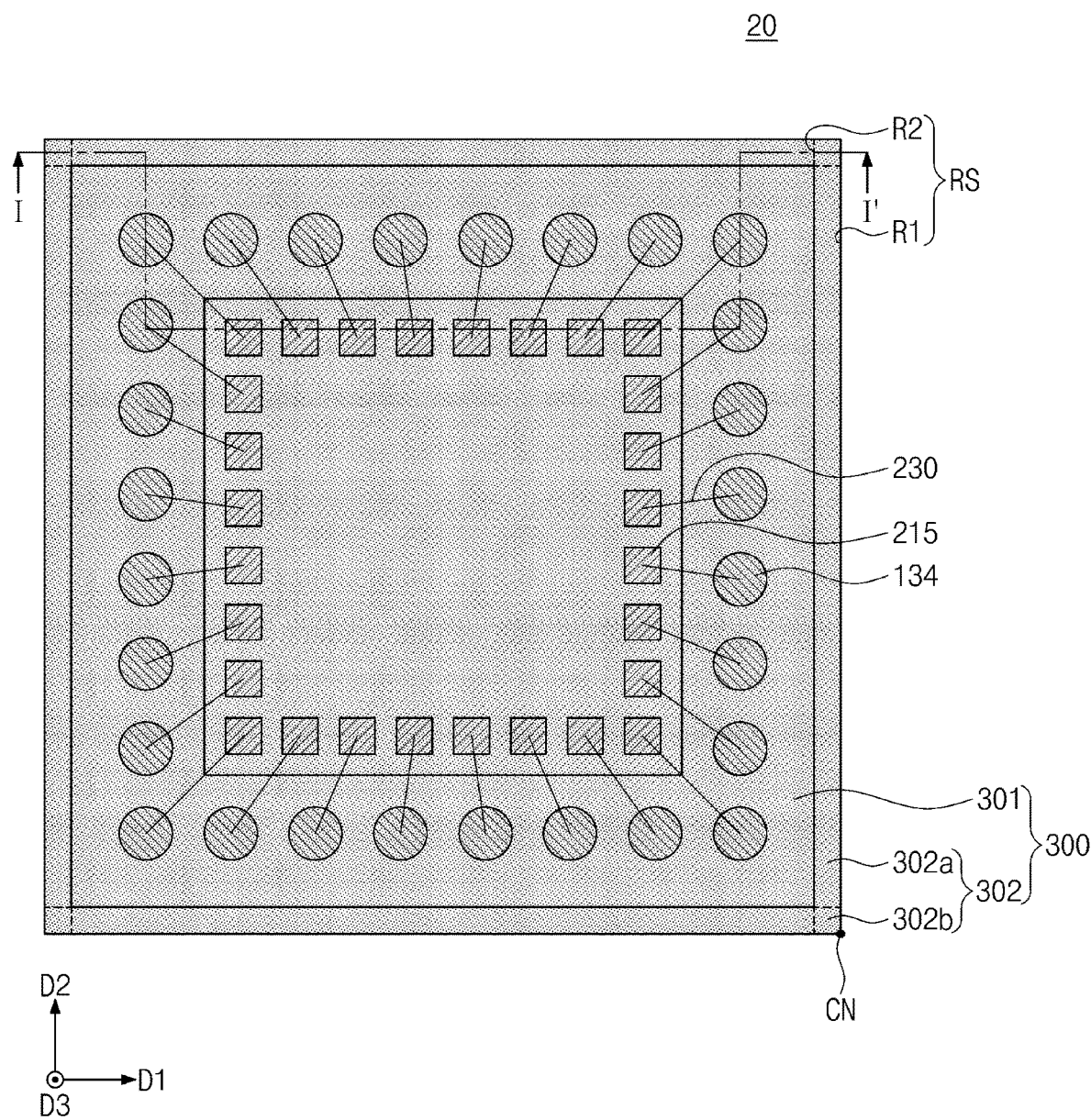
FIG. 11 is a plan view of a semiconductor package according to some embodiments of the present inventive concepts.

FIG. 11 is a plan view of a semiconductor package 20 according to some embodiments. A repeated description of components described with reference to with FIGS. 1A and 1B will be omitted, except for the following descriptions.

Referring to FIG. 11, in an embodiment, the first recess part R1 is formed along an edge on the first surface 110a of the core layer 110.

In an embodiment, when viewed in a plan view, the first part 302a of the protrusion 302 in the molding member 300 has a tetragonal ring shape that surrounds an outer surface of the core layer 110. The first part 302a of the protrusion 302 continuously extends on edges of the second surface 110b of the core layer 110. The core layer 110 has a cross-section, taken along line I-I' of FIG. 11, that is substantially the same as that of FIG. 1B.

FIGS. 12 to 15 are plan views that illustrate a method of fabricating the semiconductor package 20 of FIG. 11.

Figure 12:
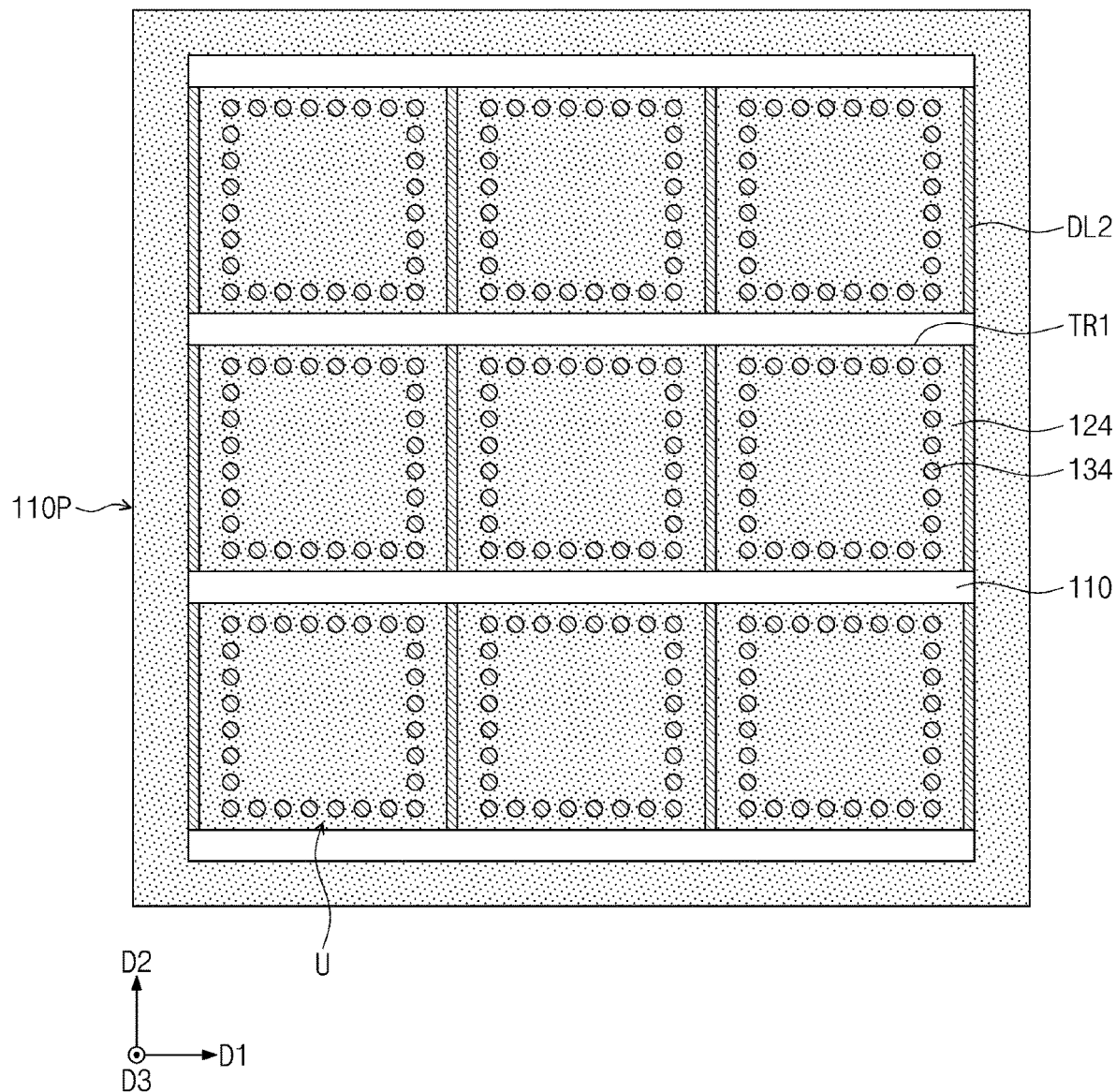
FIGS. 12 to 15 are plan views that illustrate a method of fabricating a semiconductor package of FIG. 11.

Referring to FIG. 12, in an embodiment, first trenches TR1 are formed on corresponding first dummy lines DL1. The first trenches TR1 are formed on the edges parallel to the first direction D1 of the units U. The first trench TR1 extend in the first direction D1 between a plurality of units U. The first trenches TR1 are formed at edges of the units U.

In an embodiment, the first dummy lines DL1 are completely removed during the formation of the first trenches TR1. The second dummy lines DL2, the first solder resist layer 124, and the core layer 110 are partially removed during the formation of the first trenches TR1. The first trenches TR1 separate the second dummy lines DL2 into segments. The formation of the first trenches TR1 exposes a top surface of the core layer 110 on the edges of the units U. The top surface of the core layer 110 is exposed in a linear shape when viewed in a plan view.

Figure 13:
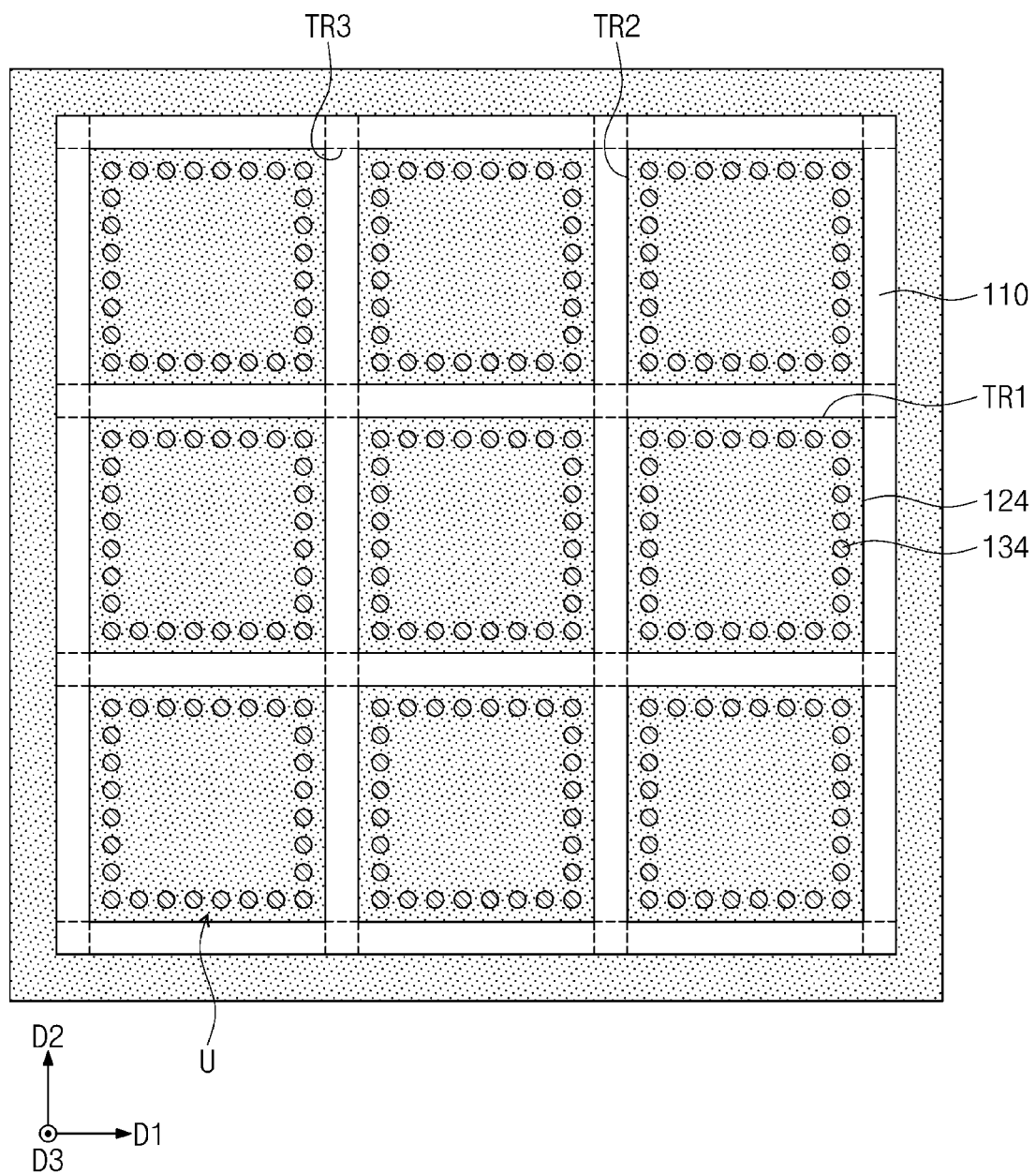

Referring to FIG. 13, in an embodiment, second trenches TR2 are formed. The second trenches TR2 are formed on edges parallel to the second direction D2 of the units U. The second trench TR2 extend in the second direction D2 between the plurality of units U. Third trenches TR3 are formed at regions where the first trenches TR1 overlap the second trenches TR2. The third trenches TR3 are deeper in the core layer 110 than the first trenches TR1 and second trenches TR2. The second dummy lines DL2 are completely removed during the formation of the second trenches TR2. The first solder resist layer 124 and the core layer 110 are partially removed. The first solder resist layer 124 and the core layer 110 are additionally removed in part during the formation of the second trenches TR2.

In an embodiment, when the second trenches TR2 are formed, the third trenches TR3 are formed at the vertices of the units U. The third trenches TR3 have a bottom surface that is lower than those of the first and second trenches TR1 and TR2. When viewed in a plan view, the top surface of the core layer 110 is exposed in a grid shape that surrounds each unit U.

Figure 14:
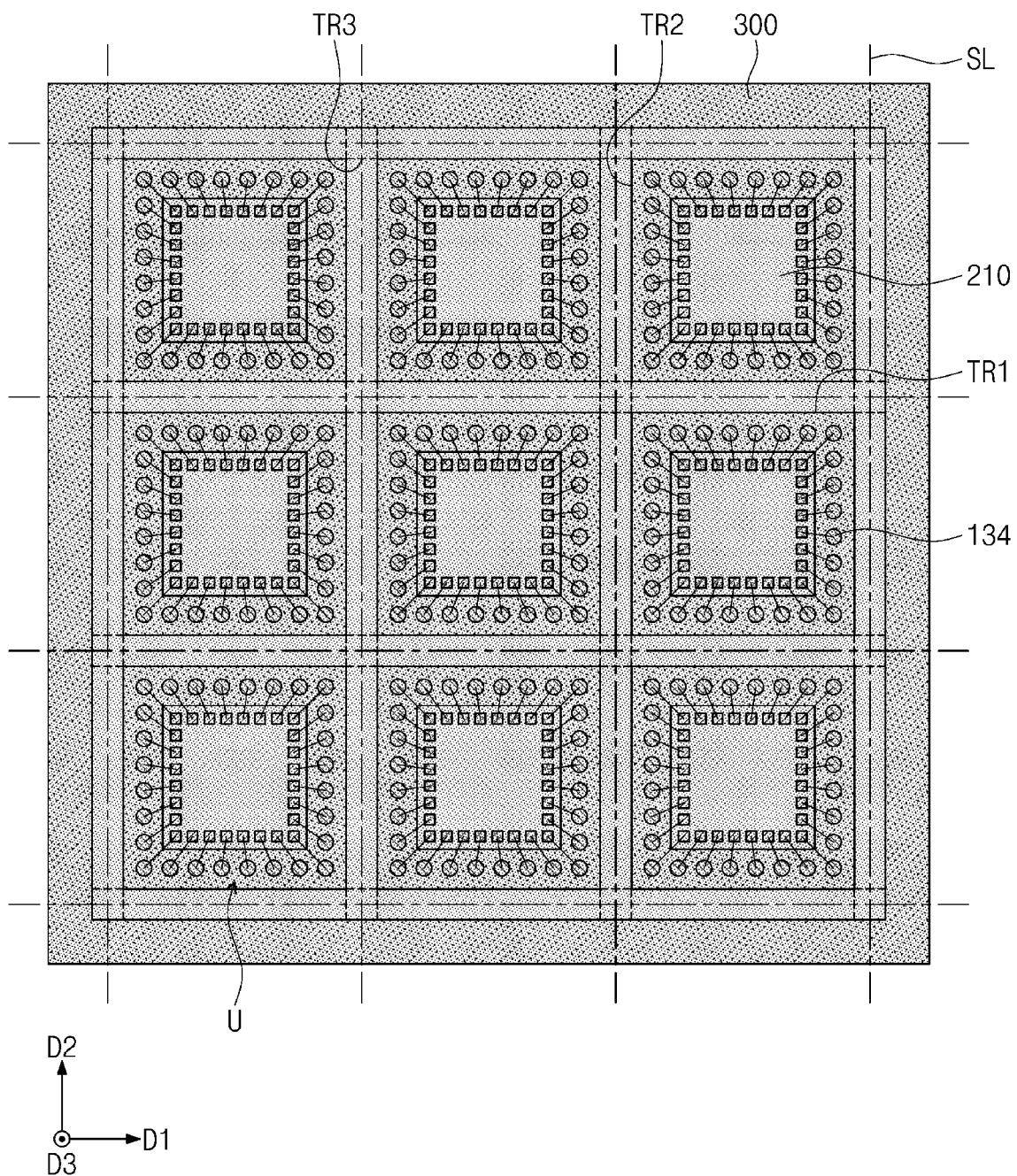

Referring to FIG. 14, in an embodiment, semiconductor chips 210 are mounted on the core layer 110. After that, a molding member 300 is formed that covers the semiconductor chips 210 and the first surface 110a of the core layer 110. The molding member 300 fills the first, second, and third trenches TR1, TR2, and TR3.

Figure 15:
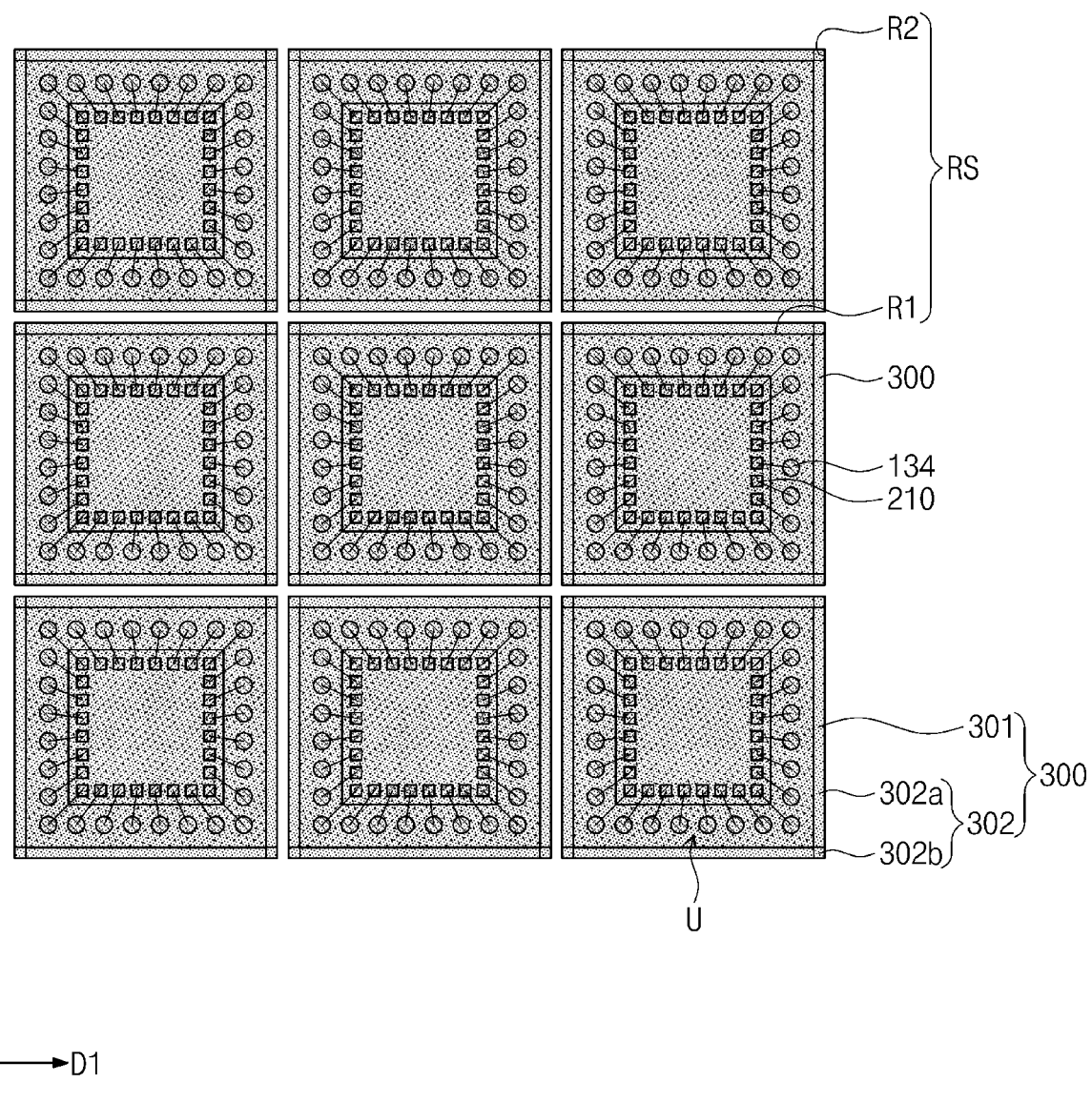

Referring to FIGS. 14 and 15, in an embodiment, a sawing process is performed along sawing lines SL that overlap the first and second trenches TR1 and TR2. The sawing process and external connection terminal attachment form the semiconductor package 20 of FIG. 11.

Figure 16A:
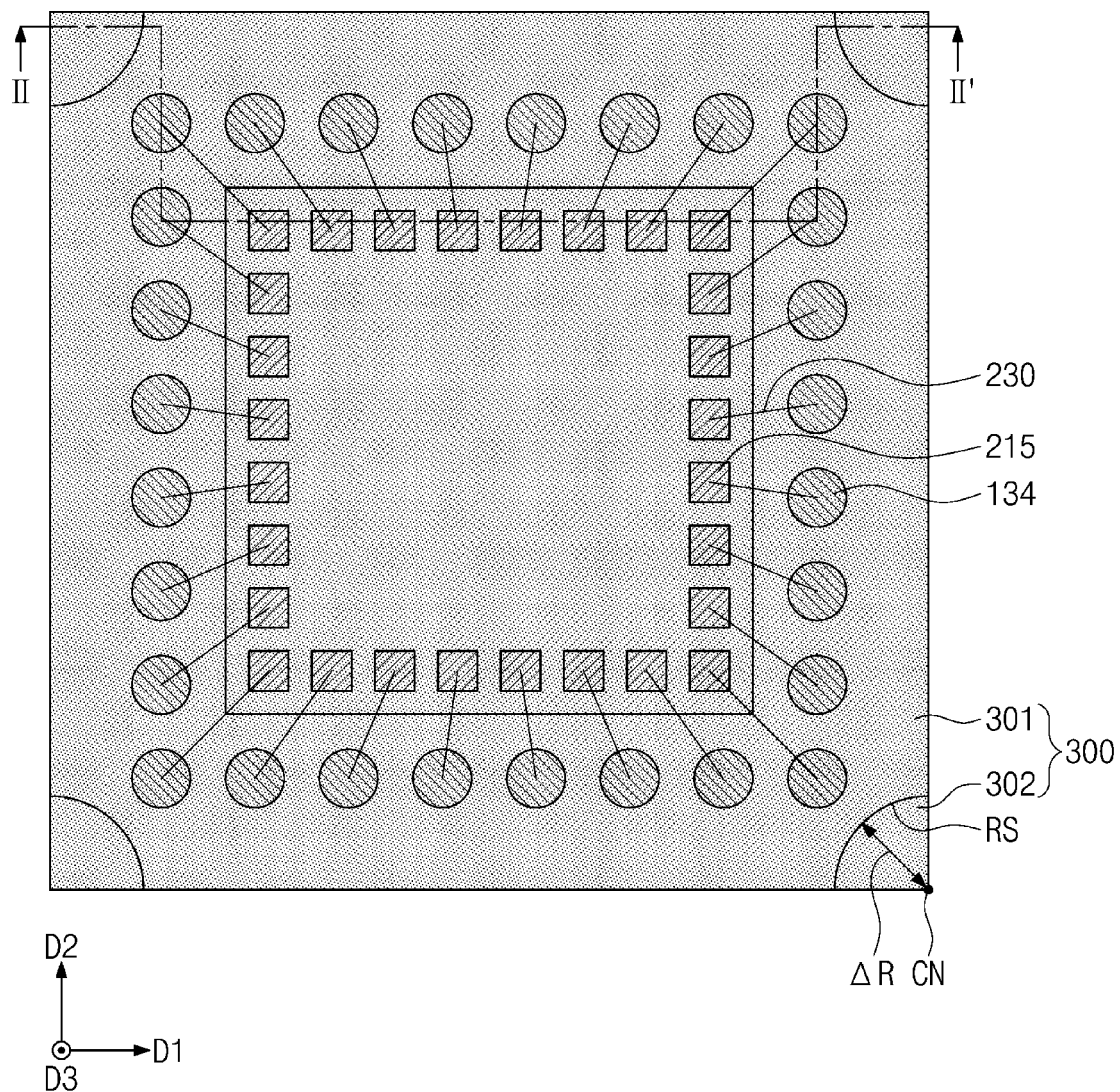
FIG. 16A is a plan view of a semiconductor package according to some embodiments of the present inventive concepts.
Figure 16B:
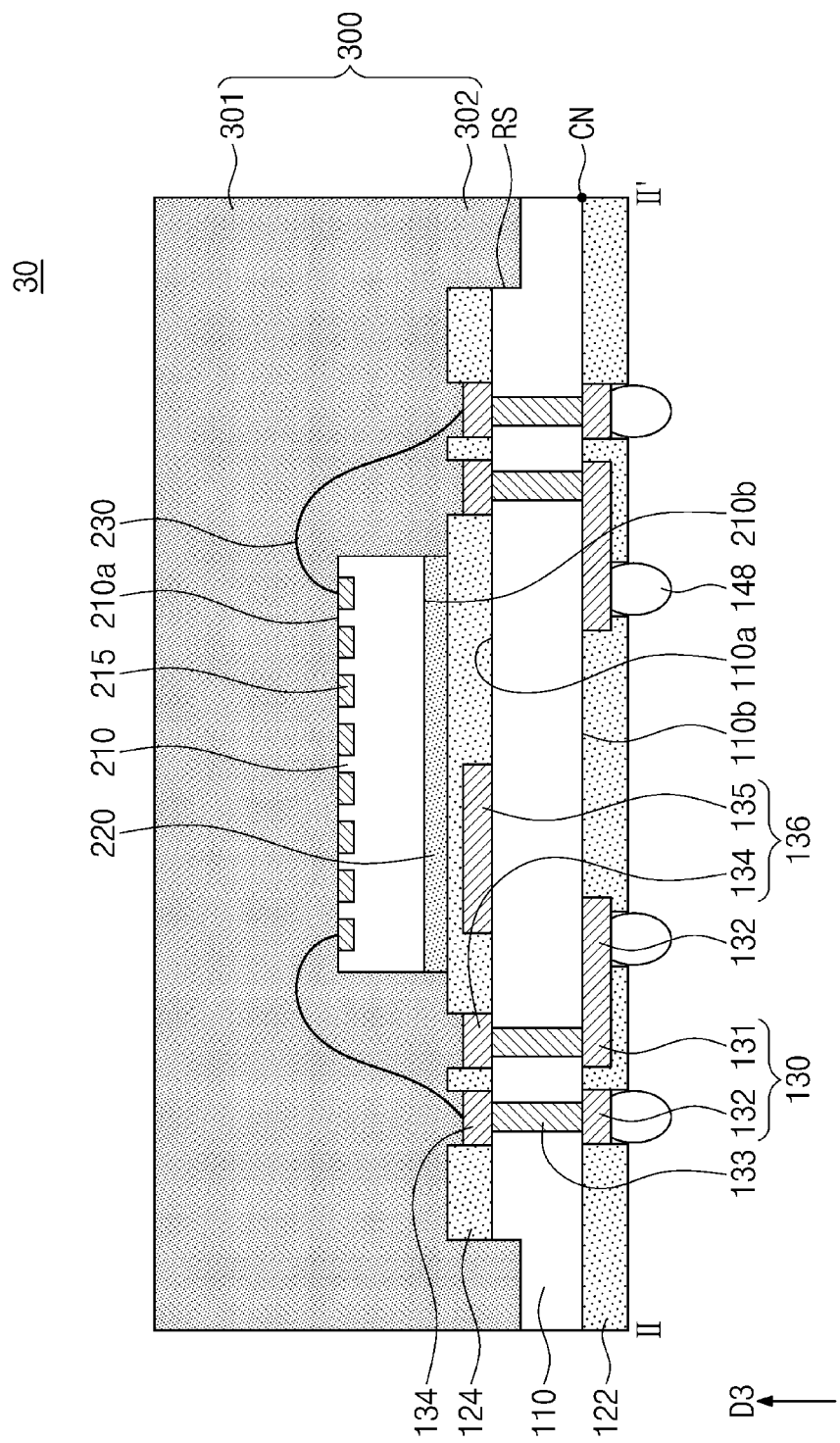
FIG. 16B is a cross-sectional view taken along line II-II' of FIG. 16A.

FIG. 16A is a plan view of a semiconductor package 30 according to some embodiments of the present inventive concepts. FIG. 16B is a cross-sectional view taken along line II-II' of FIG. 16A. A repeated description of components described with reference to with FIGS. 1A and 1B will be omitted, except for the following description.

Referring to FIGS. 16A and 16B, in an embodiment, when viewed in a plan view, a recess RS is formed at a vertex CN on the second surface 110b of the core layer 110. An inner wall of the recess RS has a rounded shape when viewed in a plan view. The inner wall of the recess RS is spaced apart by a certain width ΔR from the vertex CN of the second surface 110b. The inner wall may be a semicircle whose radius is ΔR.

Figure 17:
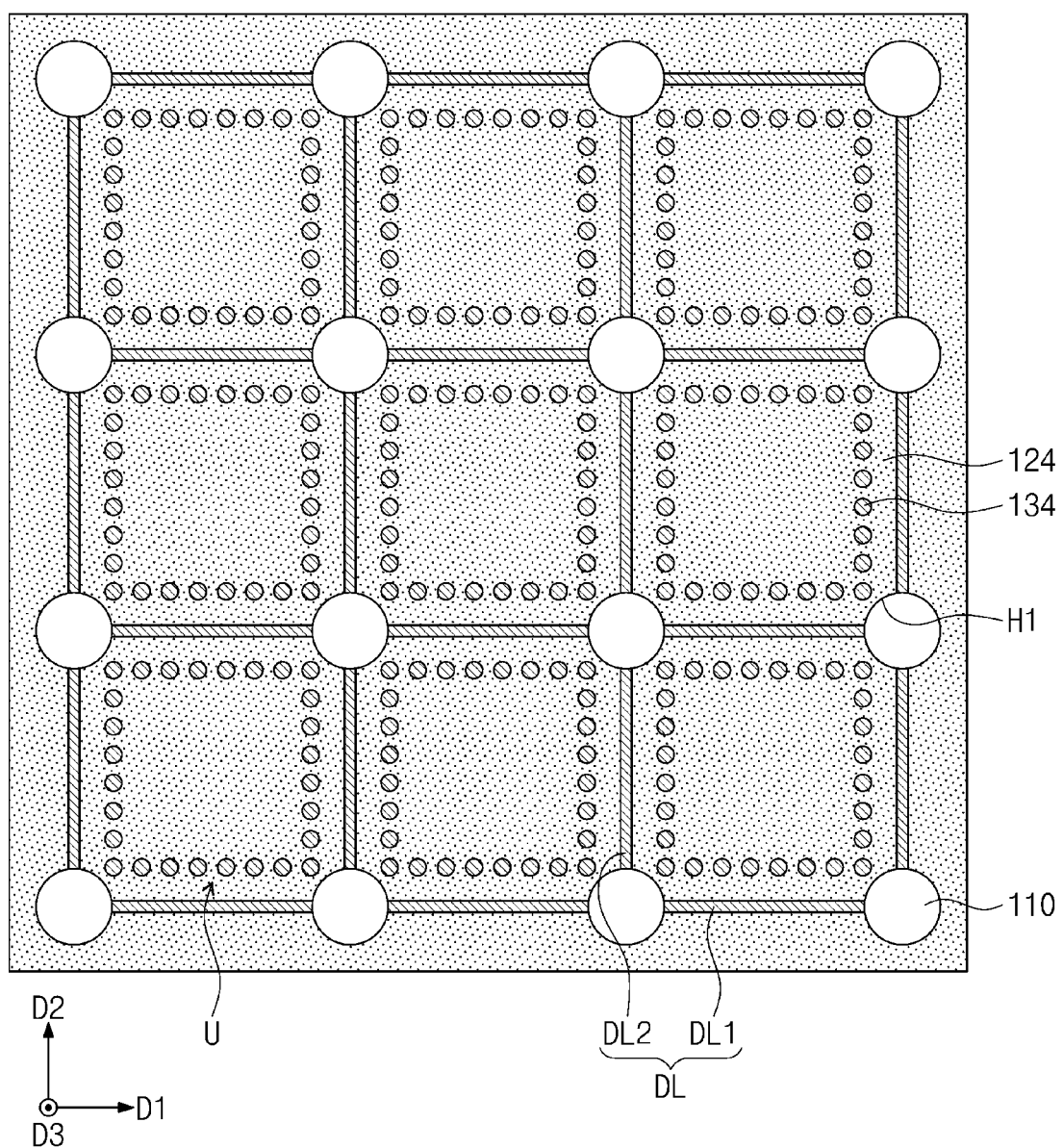
FIGS. 17 to 19 are plan views that illustrate a method of fabricating the semiconductor package of FIG. 16A.
Figure 18:
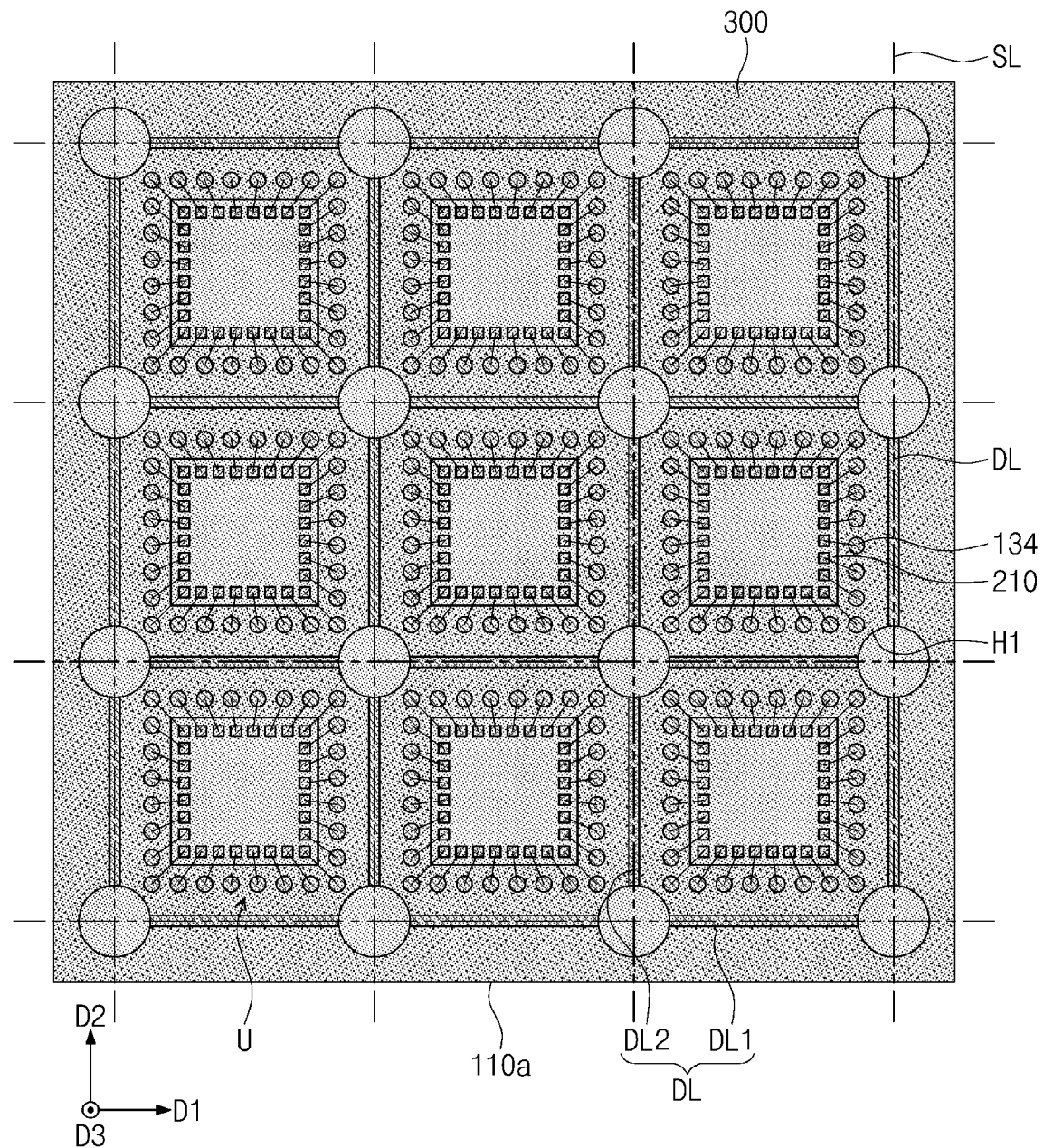
Figure 19:
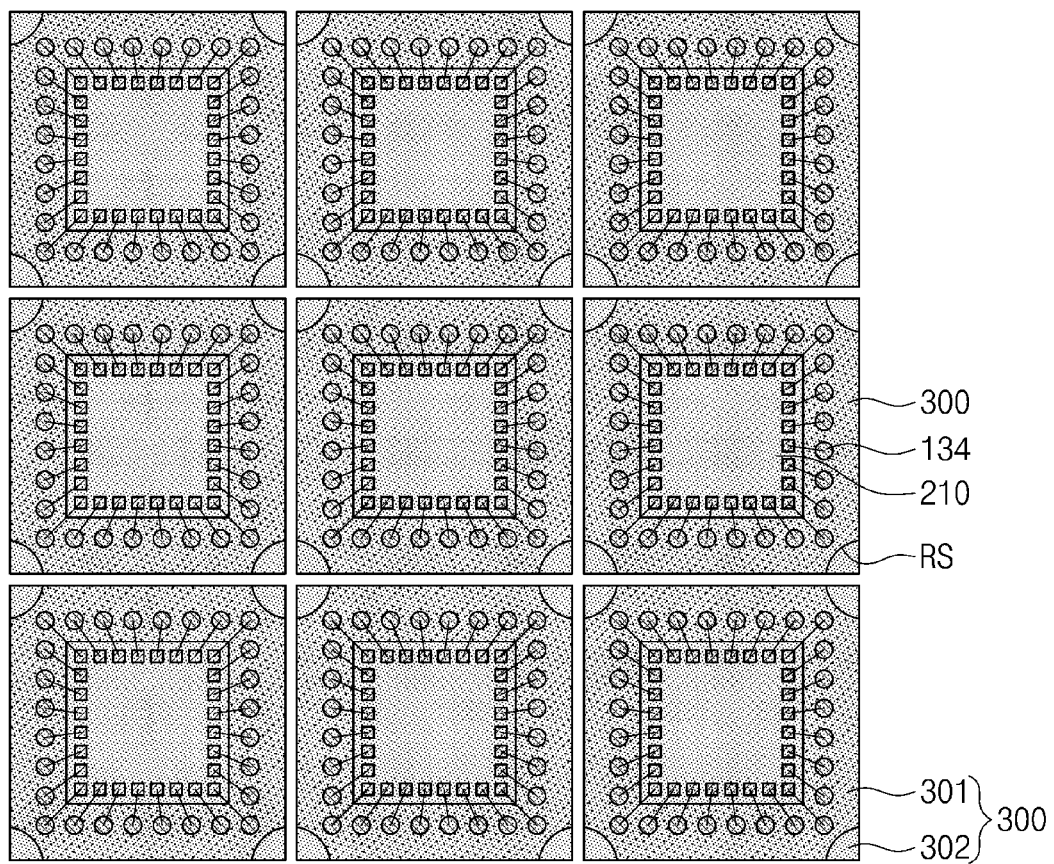

FIGS. 17 to 19 are plan views that illustrate a method of fabricating the semiconductor package 30 of FIG. 16A.

Referring to FIG. 17, in an embodiment, holes H1 are formed at intersections between the first dummy lines DL1 and the second dummy lines DL2. The holes H1 each have a circular shape when viewed in a plan view. The holes H1 are formed on corresponding vertices of the units U. The first dummy lines DL1, the second dummy lines DL2, the first solder resist layer 124, and the core layer 110 on the vertices of the units U are partially removed during the formation of the holes H1. The formation of the holes H1 exposes a top surface of the core layer 110 at each vertex of the units U. The top surface of the core layer 110 is exposed in a circular shape when viewed in a plan view. The holes H1 may be formed by using, for example, a laser drilling process.

Referring to FIG. 18, in an embodiment, semiconductor chips 210 are mounted on the core layer 110. After that, a molding member 300 is formed that covers the semiconductor chips 210 and the first surface 110a of the core layer 110. The molding member 300 fills the holes H1.

Referring to FIGS. 18 and 19, a sawing process is performed along sawing lines SL that overlap the first and second dummy lines DL1 and DL2. The sawing process separates individual units of a plurality of units U from each other.

In the sawing process, in an embodiment, the hole H1 is converted into a recess RS. In the sawing process, the molding member 300 that fills the hole H1 is converted into a protrusion 302 that fills the recess RS.

According to embodiments of the present inventive concepts, since a trench is formed on a sawing line of a package substrate, it is possible to interrupt a stress that continuously propagates along an extending direction of the package substrate and accordingly to protect the package substrate from shrinkage and warpage.

According to embodiments of the present inventive concepts, since a molding member fills the trench, and since the trench and the molding member are formed at each corner or edge of the package substrate, it is possible to prevent warpage of each unit package.

Although some embodiments of the present inventive concepts have been described with reference to accompanying figures, it will be understood that various changes in form and details can be made therein without departing from the spirit and scope of embodiments of the present inventive concepts. It therefore will be understood that embodiments described above are just illustrative but not limitative in all aspects.

What is claimed is:

1. A semiconductor package, comprising:
a base substrate that includes a first surface and a second surface that face each other;
a plurality of first metal line patterns disposed on the first surface;
a plurality of second metal line patterns disposed on the second surface;
a plurality of vias that penetrate the base substrate and connect the first metal line patterns to the second metal line patterns;
a semiconductor chip disposed on the first surface; and
a molding member that covers the first surface and the semiconductor chip,
wherein the base substrate includes at least one recess at a corner of the base substrate, wherein the recess extends from the first surface toward the second surface, and
wherein the molding member includes a protrusion that fills the recess,
wherein a plurality of recesses are provided that include a first recess, a second recess, a third recess, and a fourth recess, each of the first to fourth recesses includes a first recess part and a second recess part below the first recess part, and a bottom surface of the second recess part is closer to the second surface than a bottom surface of the first recess part.

2. The semiconductor package of claim 1, wherein a bottom surface of the recess is vertically spaced apart from the second surface.

3. The semiconductor package of claim 1, wherein
the second surface has a tetragonal shape when viewed in a plan view, and
the first to fourth recesses are formed on corresponding vertices of the second surface.

4. The semiconductor package of claim 3, wherein
a portion of the first recess part extends in a first direction from a corresponding vertex of the second surface, the first direction being parallel to the second surface,
a remaining; portion of the first recess extends in a second direction from the corresponding vertex of the second surface, the second direction being parallel to the second surface and perpendicular to the first direction,
a width in the first direction of the first recess part is greater than a width in the first direction of the second recess part, and
a width in the second direction of the first recess part is greater than a width in the second direction of the second recess part.

5. The semiconductor package of claim 1, wherein
the second surface has a tetragonal shape when viewed in plan,
the recess includes a first recess part and a plurality of second recess parts that extend from a bottom end of the first recess part,
the first recess part has a tetragonal ring shape that surrounds the first surface, and
the second recess parts are formed on corresponding vertices of the second surface.

6. The semiconductor package of claim 1, further comprising:
a first solder resist layer that is disposed on the first surface and covers the first metal line patterns; and
a second solder resist layer that is disposed on the second surface and covers the second metal line patterns,
wherein a lateral surface of the first solder resist layer is an inner wall of the recess.

7. The semiconductor package of claim 1, wherein the base substrate includes a dielectric layer,
wherein the dielectric layer includes a glass fiber.

8. A semiconductor package, comprising:
a base substrate that includes a first surface and a second surface that face each other;
a second solder resist layer disposed on the second surface;
a semiconductor chip disposed on the first surface; and
a molding member that covers the first surface and the semiconductor chip,
wherein the molding member penetrates at least a portion of the base substrate at a corner of the base substrate,
wherein the molding member includes:
a body formed on a top surface of the first solder resist layer; and
at least one protrusion that extends from the body toward the second surface at the corner of the base substrate,
wherein the at least one protrusion includes:
a first part connected to the body; and
a second part connected to a bottom end of the first part, wherein the second part extends from the first part toward the second surface,
wherein
the first part has a first width in a first direction parallel to the first surface,
the second part has a second width parallel to the first direction, and
the second width is less than the first width.

9. The semiconductor package of claim 8, further comprising:
a plurality of first metal line patterns disposed on the first surface, wherein the first solder resist layer covers the plurality of first metal line patterns;
a plurality of second metal line patterns disposed on the second surface, wherein the second solder resist layer covers the plurality of second metal line patterns; and
a plurality of vias that penetrate the base substrate and connect the plurality of first metal line patterns to the plurality of second metal line patterns.

10. The semiconductor package of claim 8, wherein a bottom surface of the at least one protrusion is vertically spaced apart from the second surface.

11. The semiconductor package of claim 8, wherein
the second surface has a tetragonal shape when viewed in a plan view,
a plurality of protrusions are provided,
the plurality of protrusions include a first protrusion, a second protrusion, a third protrusion, and a fourth protrusion,
wherein the first to fourth protrusions are formed on corresponding vertices of the second surface.

12. The semiconductor package of claim 11, wherein, when viewed in a plan view, each of the first to fourth protrusions has an "L" shape whose corner corresponds to one of the vertices of the second surface.

13. The semiconductor package of claim 8, wherein a sidewall of the protrusion is coplanar with an outer wall of the base substrate.

14. The semiconductor package of claim 8, wherein a thickness at the corner of the base substrate is less than thicknesses of other portions of the base substrate.

15. The semiconductor package of claim 8, wherein the protrusion has a plurality of bottom surfaces and a plurality of lateral surfaces that connect the bottom surfaces to each other, wherein the bottom surfaces of the protrusion have spacing distances from the second surface that increase away from vertices of the second surface.

16. A semiconductor package, comprising:

a dielectric layer that includes a first surface and a second surface that face each other, wherein the dielectric layer includes a plurality of recesses at respective corners of the dielectric layer that extend from the first surface toward the second surface;

a plurality of first metal line patterns on the first surface;

a plurality of second metal line patterns on the second surface;

a first solder resist layer disposed on the first surface and that covers the first metal line patterns;

a second solder resist layer disposed on the second surface and that covers the second metal line patterns;

a plurality of vias that penetrate the dielectric layer and connect the first metal line patterns to the second metal line patterns;

a semiconductor chip disposed on the first surface; a plurality of semiconductor chip pads on the semiconductor chip;

a plurality of bonding wires that electrically connect the semiconductor chip pads to the first metal line patterns; and a molding member that includes a body that covers the first surface and the semiconductor chip and a plurality of protrusions that fill the plurality of recesses and extend between the second surface and the first surface of the dielectric layer at respective corners of the dielectric layer, wherein the plurality of protrusions are formed on corresponding vertices of the second surface, wherein, when viewed in a plan view, each of the plurality of protrusions has an "L" shape on one of the corresponding vertices of the second surface;

wherein the body of the molding member covers a top of the first solder resist layer, and the plurality of protrusions extends between the second surface and the top surface of the first solder resist layer.

17. The semiconductor package of claim 16, wherein, when viewed in a plan view, each of the plurality of protrusions has a width in a first direction parallel to the second surface from a corner of the second surface.

18. The semiconductor package of claim 16, wherein each of the plurality of protrusions includes:

a first part connected to the body; and a second part connected to a bottom end of the first part, wherein the second part extends from the first part toward the second surface, wherein the first part has a first width in a first direction parallel to the first surface, the second part has a second width parallel to the first direction, and the second width is less than the first width.

* * * * *